United States Patent
Ahn et al.

(10) Patent No.: US 9,117,716 B2
(45) Date of Patent: *Aug. 25, 2015

(54) IMAGE SENSORS INCLUDING HYDROPHOBIC INTERFACES AND METHODS OF FABRICATING THE SAME

(71) Applicant: Samsung Electronics Co., Ltd., Suwon-si, Gyeonggi-do (KR)

(72) Inventors: Yu-jin Ahn, Seongnam-si (KR); Min-young Jung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/294,407

(22) Filed: Jun. 3, 2014

(65) Prior Publication Data

US 2014/0264509 A1    Sep. 18, 2014

Related U.S. Application Data

(63) Continuation of application No. 13/177,358, filed on Jul. 6, 2011, now Pat. No. 8,765,517.

(30) Foreign Application Priority Data

Jul. 9, 2010    (KR) .......................... 10-2010-0066412

(51) Int. Cl.
*H01L 31/0232*    (2014.01)
*H01L 27/146*    (2006.01)

(52) U.S. Cl.
CPC ...... *H01L 27/1462* (2013.01); *H01L 27/14627* (2013.01); *H01L 27/14632* (2013.01); *H01L 27/14636* (2013.01); *H01L 27/14643* (2013.01); *H01L 27/14687* (2013.01); *H01L 27/14698* (2013.01); *H01L 27/14609* (2013.01); *H01L 27/14621* (2013.01)

(58) Field of Classification Search
USPC .................. 257/292, 291, 432; 438/73, 71
See application file for complete search history.

(56) References Cited

U.S. PATENT DOCUMENTS

| 6,040,022 A | 3/2000 | Chang et al. |
| 6,861,686 B2 | 3/2005 | Lee et al. |
| 8,765,517 B2 * | 7/2014 | Ahn et al. .................. 438/73 |
| 2003/0068895 A1 | 4/2003 | Kim |
| 2004/0251549 A1 | 12/2004 | Huang et al. |
| 2008/0173964 A1 * | 7/2008 | Akram .................. 257/432 |
| 2009/0209058 A1 | 8/2009 | Kim et al. |
| 2010/0055823 A1 | 3/2010 | Kim et al. |

FOREIGN PATENT DOCUMENTS

| JP | 2007-227445 | 9/2007 |
| JP | 2008-288243 | 11/2008 |
| KR | 1020010055910 A | 7/2001 |
| KR | 1020090068931 A | 6/2009 |

* cited by examiner

*Primary Examiner* — Reema Patel
(74) *Attorney, Agent, or Firm* — Myers Bigel Sibley & Sajovec, PA

(57) ABSTRACT

A method of fabricating an image sensor device includes forming an insulating layer on a substrate including a photodiode therein, and forming a wiring structure on the insulating layer. The wiring structure includes at least one wiring layer and at least one insulating interlayer. A cavity is formed extending into the wiring structure over the photodiode to expose a surface of the at least one insulating interlayer. The surface of the at least one insulating interlayer exposed by the cavity is modified to define a hydrophobic surface. Related systems and devices are also discussed.

20 Claims, 16 Drawing Sheets

IMAGE SENSORS INCLUDING HYDROPHOBIC INTERFACES AND METHODS OF FABRICATING THE SAME

CROSS-REFERENCE TO RELATED APPLICATION

This application is a continuation of U.S. patent application Ser. No. 13/177,358 filed on Jul. 6, 2011, which application claims priority from Korean Patent Application No. 10-2010-0066412, filed on Jul. 9, 2010, in the Korean Intellectual Property Office, the disclosures of which are incorporated by reference herein in their entireties.

BACKGROUND

The inventive concept relates to image sensors, and more particularly, to image sensors capable of improving light-collection efficiency on an optical path, methods of manufacturing the image sensors, and systems including the image sensors.

Image sensors are devices or electronic components that sense optical information of a subject and transform the optical information into an electrical image signal. Image sensors may include charge-coupled device (CCD) image sensors and complementary-metal-oxide-semiconductor (CMOS) image sensors. CCD image sensors use a plurality of metal-oxide-semiconductor (MOS) capacitors in order to deliver and output electric charges. If an appropriate voltage is applied sequentially to gates of the MOS capacitors, then signal charges of respective pixels are sequentially transferred to adjacent MOS capacitors. CMOS image sensors use a plurality of transistors for a plurality of pixels, respectively, each in which a signal charge generated by a photodiode is converted into a voltage and is then output.

SUMMARY

According to some embodiments of the inventive concept, a method of fabricating an image sensor device includes forming an insulating layer on a substrate including a photodiode therein. A wiring structure is formed on the insulating layer, the wiring structure comprising at least one wiring layer and at least one insulating interlayer. A cavity is formed extending into the wiring structure over the photodiode to expose a surface of the at least one insulating interlayer. The surface of the at least one insulating interlayer exposed by the cavity is modified to provide a hydrophobic surface.

In some embodiments, the cavity may extend completely through the wiring structure to expose the surface of the at least one insulating interlayer along sidewalls thereof and a surface of the insulating layer between the sidewalls of the cavity, and the surfaces of the at least one insulating interlayer and the insulating layer may be modified to provide the hydrophobic surface along the sidewalls of the cavity and the surface of the insulating layer therebetween.

In some embodiments, the cavity may further extend at least partially into the insulating layer.

In some embodiments, the surfaces of the at least one insulating interlayer and the insulating layer may be modified by performing plasma processing to alter the surfaces of the at least one insulating interlayer and the insulating layer to provide the hydrophobic surface. For example, the plasma processing may be performed using ammonia ($NH_3$), nitrogen ($N_2$), carbon tetrafluoride ($CF_4$), sulfur hexafluoride ($SF_6$), and/or nitrogen trifluoride ($NF_3$) as a source gas.

In some embodiments, the plasma processing may remove one or more hydroxyl (—OH) groups on the surfaces using $NH_3$ radicals generated from the source gas.

In some embodiments, the plasma processing may be performed using a plasma radio frequency (RF) generator.

In some embodiments, a light transmission layer may be formed in the cavity directly on the hydrophobic surface and may extend completely through the wiring structure.

In some embodiments, a microlens may be formed on the light transmission layer opposite the hydrophobic surface. The cavity may be at least partially aligned with the microlens and the photodiode in plan view to provide an optical transmission path therebetween.

In some embodiments, the light transmission layer may be a transparent resin layer or an organic polymer compound.

In some embodiments, the substrate may include a pixel array region having the photodiode therein and a peripheral circuit region. A plurality of transistors may be formed on the substrate in the pixel array region and the peripheral circuit region prior to forming the insulating layer thereon.

In some embodiments, the wiring structure may be formed by forming respective via plugs extending through the insulating layer to electrically contact respective ones the plurality of transistors, forming a first insulating interlayer on the insulating layer, patterning the first insulating interlayer to expose the respective via plugs, and forming a first wiring layer on the respective via plugs.

In some embodiments, forming the wiring structure may further include forming a first etch stop layer on the insulating layer prior to forming the respective via plugs, forming a second etch stop layer, a second insulating interlayer, a third etch stop layer, and a third insulating interlayer on the first insulating interlayer and the first wiring layer opposite the first etch stop layer, patterning the third insulating interlayer and the third etch stop layer to define respective trenches therein, patterning the second insulating interlayer and the second etch stop layer to define respective contact holes therein exposing portions of the first wiring layer, and forming a conductive layer in the respective trenches to define a second wiring layer and in the contact holes to define respective contact plugs electrically contacting the portions of the first wiring layer. The first and second wiring layers may be copper.

In some embodiments, forming the wiring structure may further include forming a second insulating interlayer directly on the first insulating interlayer, forming a third insulating interlayer directly on the second insulating interlayer, patterning the third insulating interlayer to define respective trenches therein, patterning the second insulating interlayer to define respective contact holes therein exposing portions of the first wiring layer, and forming a conductive layer in the respective trenches to define a second wiring layer and in the contact holes to define respective contact plugs electrically contacting the portions of the first wiring layer. The first and second wiring layers may be aluminum.

According to further embodiments of the inventive concept, a method of fabricating an image sensor device includes forming a plurality of transistors on a substrate in a pixel array region thereof and in a peripheral circuit region thereof. A photodiode is formed in the substrate in the pixel array region thereof. An insulating layer is formed on the substrate, and a wiring structure is formed on the insulating layer, where the wiring structure includes at least one wiring layer and at least one insulating interlayer. A cavity is formed extending completely through the wiring structure and at least partially into the insulating layer over the photodiode in the pixel array region to expose a surface of the at least one insulating interlayer along sidewalls of the cavity and a surface of the insulating layer between sidewalls of the cavity. Plasma processing is performed using a plasma radio frequency (RF) generator to alter the surfaces of the at least one insulating interlayer and the insulating layer to provide a hydrophobic surface extending along the sidewalls of the cavity and the surface of the insulating layer therebetween. A light transmission layer is formed in the cavity directly on the hydrophobic surface and extending completely through the wiring structure, and a microlens is formed on the light transmission layer opposite the hydrophobic surface. The cavity is at least partially aligned with the microlens and the photodiode in plan view to provide an optical transmission path therebetween.

According to still further embodiments of the inventive concept, an image sensor device includes a substrate including a photodiode therein, an insulating layer on the substrate, and a wiring structure on the insulating layer. The wiring structure includes at least one wiring layer, at least one insulating interlayer, and a cavity extending therein over the photodiode. The at least one insulating interlayer has a hydrophobic surface that defines a portion of the cavity. A light transmission layer is provided in the cavity directly on the hydrophobic surface.

In some embodiments, the cavity may extend completely through the wiring structure and is defined by the hydrophobic surface of the at least one insulating interlayer along sidewalls thereof and a hydrophobic surface of the insulating layer along a surface thereof between the sidewalls of the cavity.

In some embodiments, the cavity may further extend at least partially into the insulating layer.

In some embodiments, the hydrophobic surfaces of the at least one insulating interlayer and the insulating layer may be free of hydroxyl (—OH) groups.

In some embodiments, a microlens is provided on the light transmission layer opposite the hydrophobic surface, and the cavity is at least partially aligned with the microlens and the photodiode in plan view to provide an optical transmission path therebetween.

According to other embodiments of the inventive concept, there is provided a method of manufacturing an image sensor, the method including: providing a substrate including a pixel array region and a peripheral circuit region; forming a plurality of transistors in the pixel array region and the peripheral circuit region; forming at least one photodiode in the pixel array region; forming an insulating layer on the substrate in which the plurality of transistors and the at least one photodiode are formed; forming at least one metal wiring layer and at least one interlayer insulating layer on the insulating layer; exposing a part of the at least one interlayer insulating layer by partially etching the at least one interlayer insulating layer formed at locations corresponding to the photodiode; and modifying an interface of the exposed at least one interlayer insulating layer into hydrophobic.

The method may further include forming a cavity by further etching a part of the insulating layer formed on the photodiode after etching a part of the at least one interlayer insulating layer. The modifying of the interface of the at least one interlayer insulating layer into hydrophobic may include modifying the interfaces of the insulating layer and the at least one interlayer insulating layer that are exposed by the cavity into hydrophobic. The modifying of the interfaces of the insulating layer and the at least one interlayer insulating layer that are exposed by the cavity into hydrophobic may include removing polar molecules on the interfaces by surface modification of plasma processing. The modifying of the interfaces of the insulating layer and the at least one interlayer insulating layer that are exposed by the cavity into hydrophobic may include performing plasma processing on the substrate in which the cavity is formed by using $NH_3$ as a source gas. The modifying of the interfaces of the insulating layer and the at least one interlayer insulating layer that are exposed by the cavity into hydrophobic may include removing an —OH group on the interfaces by using a $NH_3$ radical generated from the source gas.

The modifying of the interfaces of the insulating layer and the at least one interlayer insulating layer that are exposed by the cavity into hydrophobic may include performing plasma processing on the substrate in which the cavity is formed by using a plasma radio frequency (RF) generator.

The modifying of the interfaces of the insulating layer and the at least one interlayer insulating layer that are exposed by the cavity into hydrophobic may include performing plasma processing on the substrate in which the cavity is formed by using at least one selected from the group consisting of $N_2$, $CF_4$, $SF_6$ and $NF_3$ as a source gas.

The forming of the at least one metal wiring layer and the at least one interlayer insulating layer may include: forming a first etch stop layer on the insulating layer; forming a plurality of via plugs connected to the respective transistors by partially patterning the insulating layer and the first etch stop layer; forming a first interlayer insulating layer on the first etch stop layer; and forming a first metal wiring layer connected to the plurality of via plugs by partially patterning the first interlayer insulating layer.

The forming of the at least one metal wiring layer and the at least one interlayer insulating layer may further include: sequentially forming a second etch stop layer, a second interlayer insulating layer, a third etch stop layer, and a third interlayer insulating layer in the order stated on the first interlayer insulating layer and the first metal wiring layer; forming a plurality of contact plugs by patterning the second etch stop layer, the second interlayer insulating layer, the third etch stop layer, and the third interlayer insulating layer; and forming a second metal wiring layer connected to the plurality of contact plugs by patterning the third etch stop layer and the third interlayer insulating layer.

The first and second metal wiring layers may include copper.

The method may further include forming a passivation layer on the second metal wiring layer.

The forming of a cavity by etching a part of the insulating layer and the at least one interlayer insulating layer formed on the photodiode may include forming the cavity by partially etching the passivation layer, the insulating layer, the first through third interlayer insulating layers, and the first through third etch stop layers, and thus a part of the insulating layer remains on the photodiode.

The forming of the at least one metal wiring layer and the at least one interlayer insulating layer may include: forming a first etch stop layer on the insulating layer; forming a plurality of via plugs connected to the respective transistors by partially patterning the insulating layer and the first etch stop layer; forming a first metal wiring layer connected to the plurality of via plugs on the insulating layer; and forming a first interlayer insulating layer for insulating the first metal wiring layer from the insulating layer on the first metal wiring layer.

The forming of the at least one metal wiring layer and the at least one interlayer insulating layer may further include: forming a second interlayer insulating layer on the first interlayer insulating layer and the first metal wiring layer; forming a plurality of contact plugs by patterning the second interlayer insulating layer; forming a second metal wiring layer connected to the plurality of contact plugs on the second interlayer insulating layer; and forming a third interlayer insulating layer for insulating the second metal wiring layer from the second interlayer insulating layer on the second metal wiring layer.

The first and second metal wiring layers may include aluminum.

The method may further include forming a passivation layer on the second metal wiring layer.

The forming the cavity by etching a part of the at least one insulating layer formed on the photodiode may include forming the cavity by partially etching the passivation layer, the insulating layer, and the first through third insulating layers, and thus a part of the insulating layer remains on the photodiode.

The method may further include forming a light transmittance layer on the interface of the insulating layer and the at least one interlayer insulating layer that are modified into hydrophobic; forming a color filter layer on a portion of the light transmittance layer; and forming a micro lens on a portion of the color filter layer.

The light transmittance layer may be a transparent resin layer.

The light transmittance layer may be planarized by using a chemical mechanical polishing (CMP) process. The light transmittance layer may be planarized by using an etchback process.

According to still other embodiments of the inventive concept, there is provided an image sensor including: a substrate including a pixel array region and a peripheral circuit region; a plurality of transistors in the pixel array region and the peripheral circuit region; at least one photodiode disposed in the pixel array region; an insulating layer disposed on the substrate in which the plurality of transistors and the at least one photodiode are formed; at least one metal wiring layer disposed on the insulating layer and connected to the plurality of transistors; and at least one interlayer insulating layer disposed on the at least one metal wiring layer so as to insulate the at least one metal wiring layer from the insulating layer, wherein a part of the at least one interlayer insulating layer is exposed by etching, and an interface of the exposed at least one interlayer insulating layer is modified into hydrophobic.

The insulating layer and the at least one interlayer insulating layer comprise a cavity on a location corresponding to the photodiode, and the interfaces of the insulating layer and the at least one interlayer insulating layer that are exposed by the cavity are modified into hydrophobic.

The interfaces of the insulating layer and the at least one interlayer insulating layer that are exposed by the cavity are modified into hydrophobic by removing polar molecules on the interface by surface modification of plasma processing. The interfaces of the insulating layer and the at least one interlayer insulating layer that are exposed by the cavity are modified into hydrophobic by performing plasma processing on the substrate including the cavity by using $NH_3$ as a source gas. The interfaces of the insulating layer and the at least one interlayer insulating layer that are exposed by the cavity are modified into hydrophobic by removing an —OH group existing on the interface by using a $NH_3$ radical generated from the source gas.

The interfaces of the insulating layer and the at least one interlayer insulating layer that are exposed by the cavity are modified into hydrophobic by performing plasma processing on the substrate including the cavity by using a plasma RF generator.

The interfaces of the insulating layer and the at least one interlayer insulating layer that are exposed by the cavity are modified into hydrophobic by performing plasma processing on the substrate including the cavity by using at least one selected from the group consisting of $N_2$, $CF_4$, $SF_6$, and $NF_3$ as a source gas.

The image sensor may further include a first etch stop layer disposed on the insulating layer; and a plurality of via plugs formed by partially patterning the insulating layer and the first etch stop layer, wherein the at least one metal wiring layer may include a first metal wiring layer connected to the plurality of via plugs.

The at least one interlayer insulating layer may include first through third interlayer insulating layers disposed on the first metal wiring layer, wherein the image sensor may further include: a second etch stop layer disposed between the first interlayer insulating layer and the second interlayer insulating layer; a third etch stop layer disposed between the second interlayer insulating layer and the third interlayer insulating layer; and a plurality of contact plugs formed by patterning the second etch stop layer, the second interlayer insulating layer, the third etch stop layer, and the third interlayer insulating layer, wherein the at least one metal layer may further include a second metal wiring layer formed by patterning the third etch stop layer and the third interlayer insulating layer. The second metal wiring layer may include copper.

The image sensor may further include a passivation layer disposed on the second metal wiring layer.

The cavity may be formed by partially etching the passivation layer, the insulating layer, the first through third interlayer insulating layers, and the first through third etch stop layers, and thus a part of the insulating layer remains on the photodiode.

The at least one interlayer insulating layer may include first through third interlayer insulating layers disposed on the first metal wiring layer, wherein the image sensor may further include a plurality of contact plugs formed by patterning the second interlayer insulating layer, wherein the at least one metal wiring layer may further include a second metal wiring layer insulated from the second interlayer insulating layer by the third interlayer insulating layer. The second metal wiring layer may include aluminum.

The image sensor may further include a passivation layer disposed on the second metal wiring layer.

The cavity may be formed by partially etching the passivation layer, the insulating layer, and the first through third insulating layers, and thus a part of the insulating layer remains on the photodiode.

The image sensor may further include a light transmittance layer disposed on the interface of the insulating layer and the at least one interlayer insulating layer that are modified into hydrophobic; a color filter layer disposed on a portion of the light transmittance layer; and a micro lens disposed on a portion of the color filter layer.

The light transmittance layer may be a transparent resin layer. The light transmittance layer may be planarized by using a chemical mechanical polishing (CMP) process. The light transmittance layer may be planarized by using an etchback process.

According to yet other embodiments of the inventive concept, there is provided an electronic system including: an image sensor according to the above embodiments; a processor for communicating with the image sensor via a bus; and an input/output device for communicating with the bus.

BRIEF DESCRIPTION OF THE DRAWINGS

Exemplary embodiments of the inventive concepts will be more clearly understood from the following detailed description taken in conjunction with the accompanying drawings in which.

DETAILED DESCRIPTION

Figure 1:
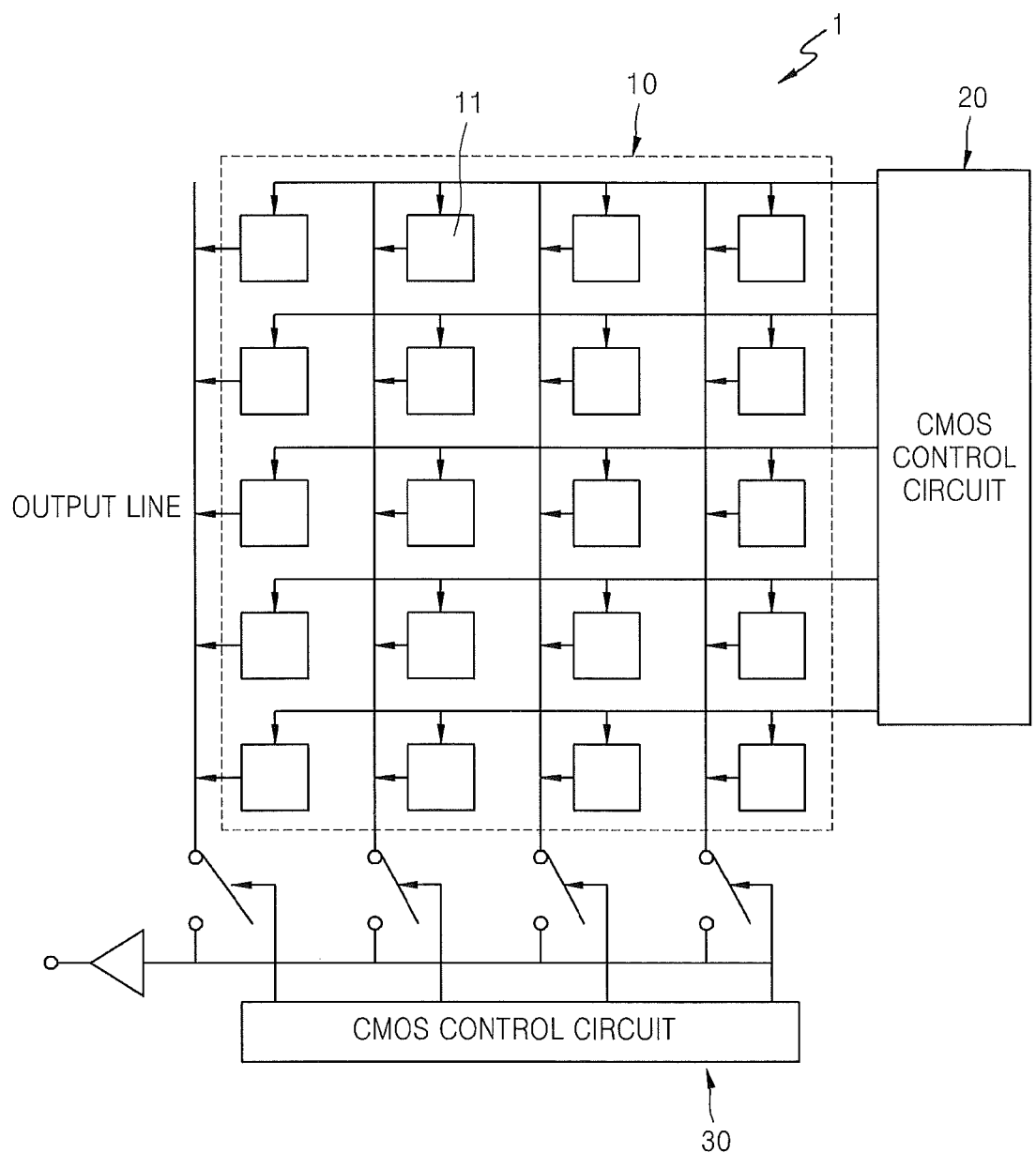
FIG. 1 is a schematic diagram illustrating an image sensor according to some embodiments of the inventive concepts.

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are provided so that this disclosure will be thorough and complete, and will fully convey the scope of the present inventive concepts to those skilled in the art. In the drawings, the sizes and relative sizes of layers and regions may be exaggerated for clarity. Like numerals refer to like elements throughout.

It will be understood that when an element or layer a layer (or film) such as a conductive layer, a semiconductor layer, and a dielectric layer is referred to as being "on," "connected to" or "coupled to" another element or layer, it can be directly on, connected or coupled to the other element or layer or intervening elements or layers may be present. In contrast, when an element is referred to as being "directly on," "directly connected to," "directly coupled to," or "in direct contact with" another element or layer, there are no intervening elements or layers present. Other expressions for describing relationships between elements, for example, "between" and "immediately between" or "neighboring" and "directly neighboring" may also be understood likewise.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. As used herein, the term "and/or" includes any and all combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

FIG. 1 is a schematic diagram illustrating an image sensor 1 according to some embodiments of the inventive concepts.

Referring to FIG. 1, the image sensor 1 may include a pixel array 10 and complementary-metal-oxide-semiconductor (CMOS) control circuits 20 and 30. The pixel array 10 may include a plurality of unit pixels 11 arranged in a matrix array. The CMOS control circuits 20 and 30 disposed around the pixel array 10 may each include a plurality of CMOS transistors (not shown), transmit predetermined signals to the plurality of unit pixels 11, and control output signals. For example, the CMOS control circuit 20 may include a row driver, and the CMOS control circuit 30 may include a correlated double sampling (CDS) unit, a comparator, and an analog-to-digital (AD) converter. In this regard, a structure of the unit pixel 11 may vary according to some embodiments with respect to the components that constitute a pixel, and a structure including one to five transistors may be used.

Figure 2:
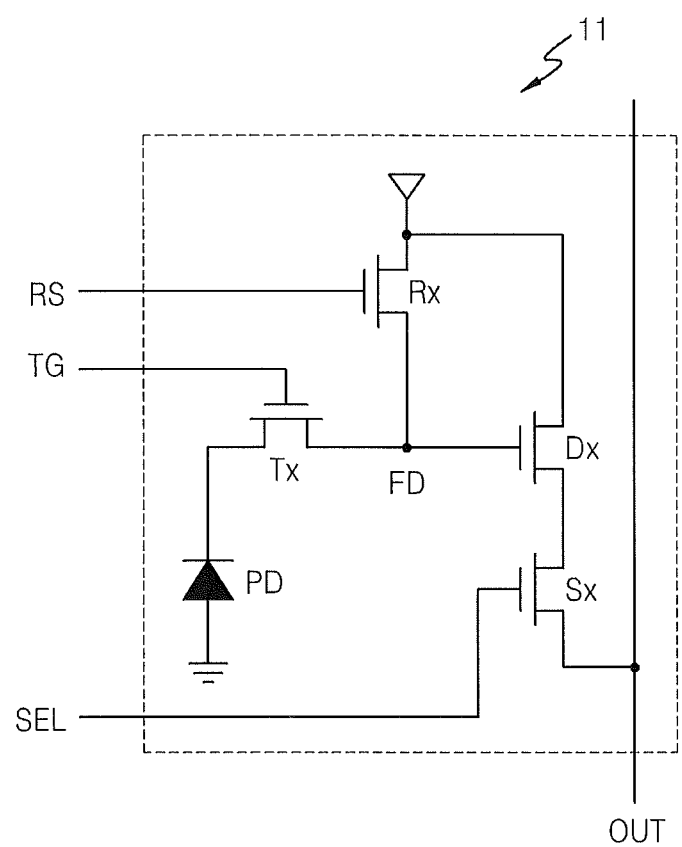
FIG. 2 is a circuit diagram illustrating a unit pixel included in the image sensor of FIG. 1.

FIG. 2 is a circuit diagram illustrating the unit pixel 11 included in the image sensor 1 of FIG. 1. FIG. 2 illustrates a schematic layout illustrating an equivalent circuit diagram of the unit pixel 11 comprised of one photodiode and four transistors.

Referring to FIG. 2, the unit pixel 11 may include a photodiode PD, a transfer transistor Tx, a reset transistor Rx, a drive transistor Dx, and a select transistor Sx. The photodiode PD receives light and responsively generates photocharges.

The transfer transistor Tx transfers the photocharges generated by the photodiode PD to a floating diffusion region FD. The reset transistor Rx periodically resets the photocharges stored in the floating diffusion region FD. The drive transistor Dx functions as a source follower buffer amplifier and buffers signals according to the photocharges charged in the floating diffusion region FD. The select transistor Sx performs switching and addressing for selecting the unit pixel 11. In this regard, RS denotes a signal applied to a gate of the reset transistor Rx, and TG denotes a signal applied to a gate of the transfer transistor Tx.

Figure 3:
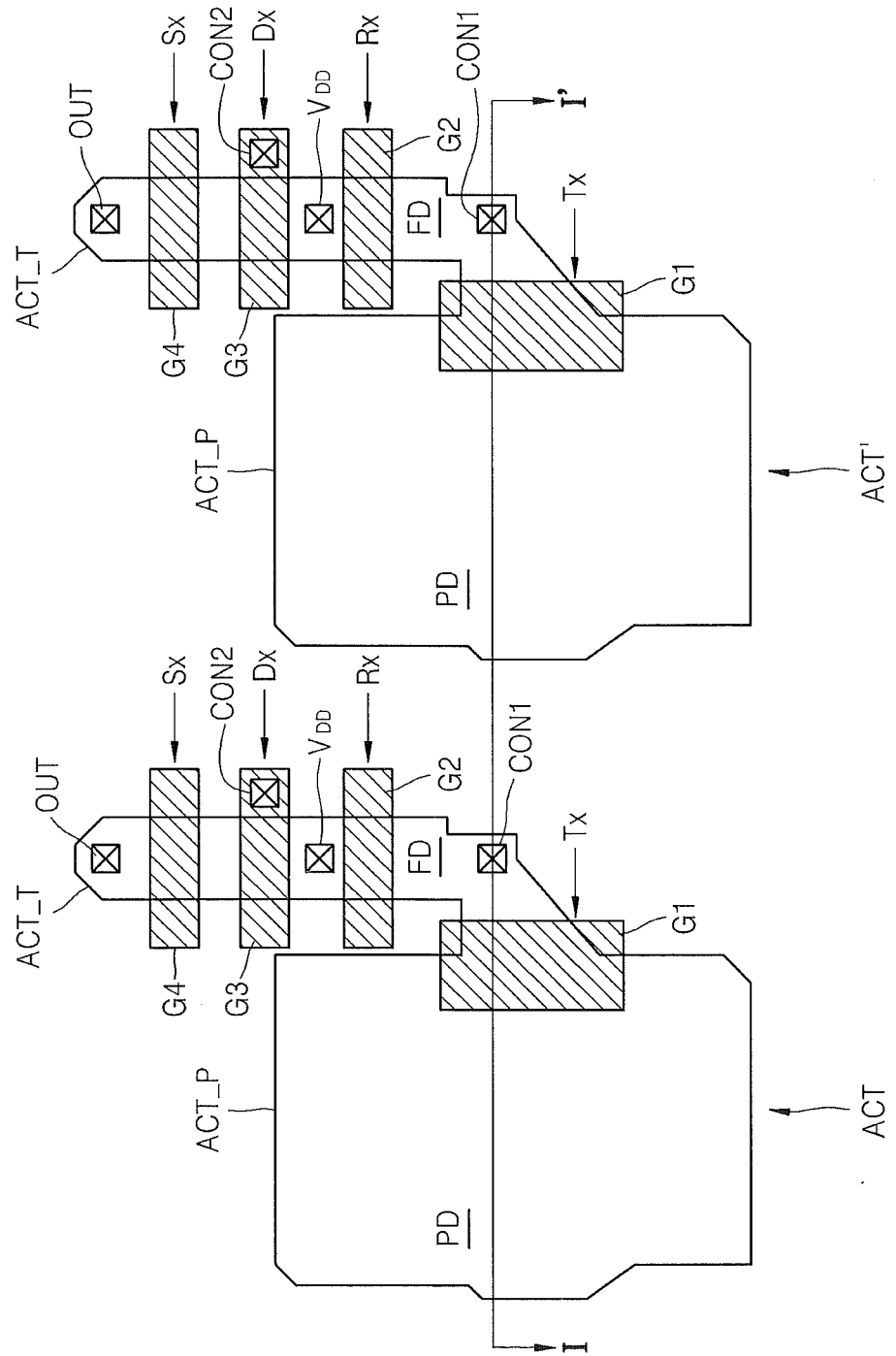
FIG. 3 is a schematic layout of a plurality of unit pixels included in the image sensor of FIG. 1.

FIG. 3 is a schematic layout illustrating ones of the plurality of unit pixels 11 included in the image sensor 1 of FIG. 1 in plan view. For convenience of explanation, FIG. 3 illustrates two adjacent unit pixels 11, each of which has a configuration corresponding to the equivalent circuit diagram of FIG. 2.

Referring to FIG. 3, the unit pixels 11 may include active regions ACT and ACT' defined in a predetermined form in a pixel array region in a semiconductor substrate. Each of the active regions ACT and ACT' is divided into a photodiode region ACT_P in which the photodiode PD is formed and a transistor region ACT_T in which transistors are formed. The photodiode region ACT_P, which is a light-receiving region in the active regions ACT and ACT', may be formed in a quadrilateral shape in a plan view, that is, as seen from above, so as to occupy a predetermined region of the semiconductor substrate in the unit pixel 11. The transistor region ACT_T may partially contact the photodiode region ACT_P and may be formed to have a shape in which at least one portion thereof is bent.

A gate G1 of the transfer transistor Tx is disposed at a boundary between the photodiode region ACT_P and the transistor region ACT_T, in each of the active regions ACT and ACT'. A gate G2 of the reset transistor Rx, a gate G3 of the drive transistor Dx, and a gate G4 of the select transistor Sx are disposed apart from each other at predetermined intervals in the transistor region ACT_T, in each of the active regions ACT and ACT'. The order of arrangement of the transfer transistor Tx, the reset transistor Rx, the drive transistor Dx, and the select transistor Sx is shown by way of example, and thus may vary under different conditions and/or in other embodiments.

A power supply terminal $V_{DD}$ is connected to a source of the reset transistor Rx. When the reset voltage RS is applied to the gate G2 of the reset transistor Rx (see FIG. 2), the reset transistor Rx is turned on, and a potential of the floating diffusion region FD is charged by the power supply voltage $V_{DD}$ connected to the source of the reset transistor Rx. Thus, the floating diffusion region FD is reset to a predetermined voltage ($V_{DD}-V_{th}$, where $V_{th}$ is a threshold voltage of the reset transistor Rx).

Electric charges of the floating diffusion region FD are applied to the gate G3 of the drive transistor Dx via a wiring (not shown) for connecting a contact CON1 and a contact CON2, thereby controlling current flowing through the select transistor Sx turned on by a selection signal SEL applied to the gate G4 of the select transistor Sx. It may be advantageous for the wiring connecting the contact CON1 and the contact CON2 to have a relatively short path to improve conversion efficiency, which may be affected by an increase in capacitance in a conductive layer including the wiring. In configuring the wiring, the contact CON1 need not be connected to the contact CON2 disposed in the same active region ACT, and may be connected to another contact CON2 disposed in the active region ACT' adjacent to the contact CON1 so as to enable short path routing of the wiring. Current flowing through the select transistor Sx is output as an output signal of the unit pixel 11 from an output terminal OUT of the unit pixel 11, and the output signal is read from a load transistor (not shown) connected to the output terminal OUT of the unit pixel 11.

FIGS. 4A through 4F are cross-sectional views illustrating fabrication steps in a method of manufacturing the image sensor 1, according to some embodiments of the inventive concepts. The pixel array regions of FIGS. 4A through 4F correspond to a cross-section taken along a line I-I' of FIG. 3.

Figure 4A:
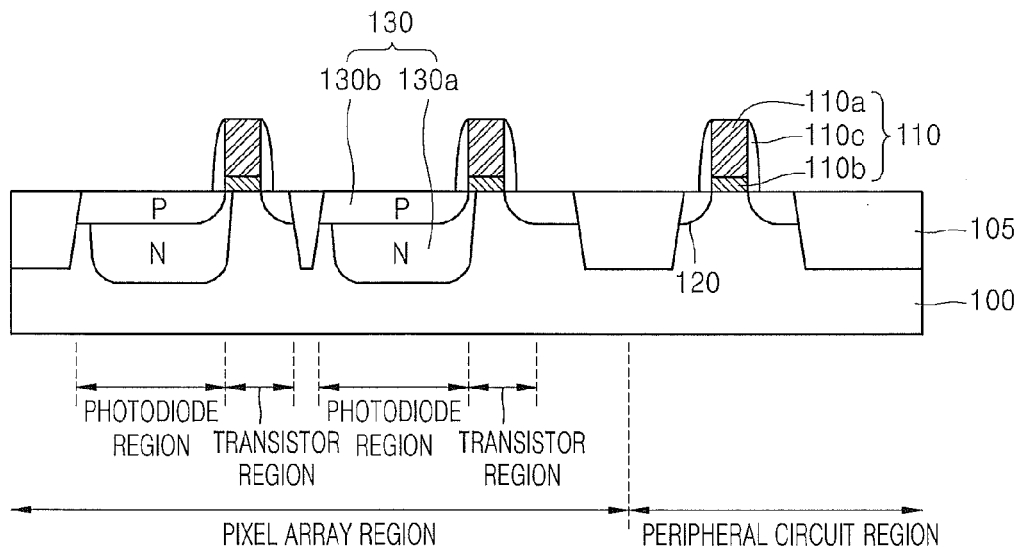
FIGS. 4A through 4F are cross-sectional views sequentially illustrating a method of manufacturing the image sensor of FIG. 1, according to some embodiments of the inventive concepts.

Referring to FIG. 4A, a substrate 100 including a pixel array region and a peripheral circuit region is provided. A plurality of unit pixels are disposed in the pixel array region. The unit pixels include a plurality of photodiode regions where a plurality of photodiodes 130 (which are light-receiving portions) are formed, and a plurality of transistor regions where a plurality of transistors 110 (such as a transfer transistor, a reset transistor, a drive transistor, and a select transistor) are formed. The transistors 110 for driving the transistors 110 included in the pixel array region are disposed in the peripheral circuit region. In embodiments of the inventive concepts as shown in FIGS. 4A-4F, the transistors 110 formed in the respective transistor regions of the pixel array region and the transistors 110 formed in the peripheral circuit region may be simultaneously formed by using the same process.

The substrate 100 may be a semiconductor substrate including any one selected from the group consisting of silicon, silicon-on-insulator, silicon-on-sapphire, germanium, silicon germanium, and gallium-arsenide. In the current embodiment of the inventive concepts, the substrate 100 may be a P-type semiconductor substrate. A plurality of device isolation layers 105 each defining an active region may be formed in the substrate 100 by using a shallow trench isolation (STI) process. Although not shown in the drawing, an epitaxial layer may be formed on the substrate 100, and the photodiodes 130 and the transistors 110 may be formed in the epitaxial layer.

A plurality of gate insulating layers 110b and a plurality of gate electrode layers 110a are sequentially stacked in the order stated on the substrate 100 and are then patterned, thereby forming the transistors 110. A plurality of spacers 110c may be formed on respective sidewalls of the transistors 110. A plurality of source/drain regions 120 are respectively formed at both sides of each of the transistors 110 by doping the substrate 100 with impurities. In this regard, the gate insulating layers 110b may have a single-layered structure or a multiple-layered structure including any one or more selected from the group consisting of silicon oxide ($SiO_2$), silicon nitride ($Si_3N_4$), silicon oxynitride (SiON), hafnium dioxide ($HfO_2$), hafnium silicon oxide ($HfSi_xO_y$), aluminum oxide ($Al_2O_3$), and zirconium oxide ($ZrO_2$). The gate electrode layers 110a may have a single-layered structure or a multiple-layered structure including any one or more selected from the group consisting of polysilicon, aluminum (Al), gold (Au), beryllium (Be), bismuth (Bi), cobalt (Co), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and zirconium (Zr), or a nitride thereof and a silicide thereof. In addition, the spacers 110c may include silicon nitride.

N-type impurities, such as phosphorus (P), arsenic (As), or antimony (Sb), are injected into the photodiode regions of the substrate 100 so as to form a plurality of first wells 130a, and P-type impurities, such as boron (B), gallium (Ga), or indium (In), are injected into the photodiode regions of the substrate 100 so as to form a plurality of second wells 130b, thereby forming the photodiodes 130, which are P—N junction diodes. However, embodiments of the inventive concepts are not limited thereto, and thus the first wells 130a may be formed by injecting P-type impurities into the photodiode regions of the substrate 100, and the second wells 130b may be formed by injecting N-type impurities. In addition, the order for forming the first wells 130a and the second wells 130b may be changed. In the illustrated embodiment of the inventive concepts, the transistors 110 may be formed after the photodiodes 130 are formed. However, in other embodiments of the inventive concepts, the photodiodes 130 may be formed after the transistors 110 are formed.

Figure 4B:
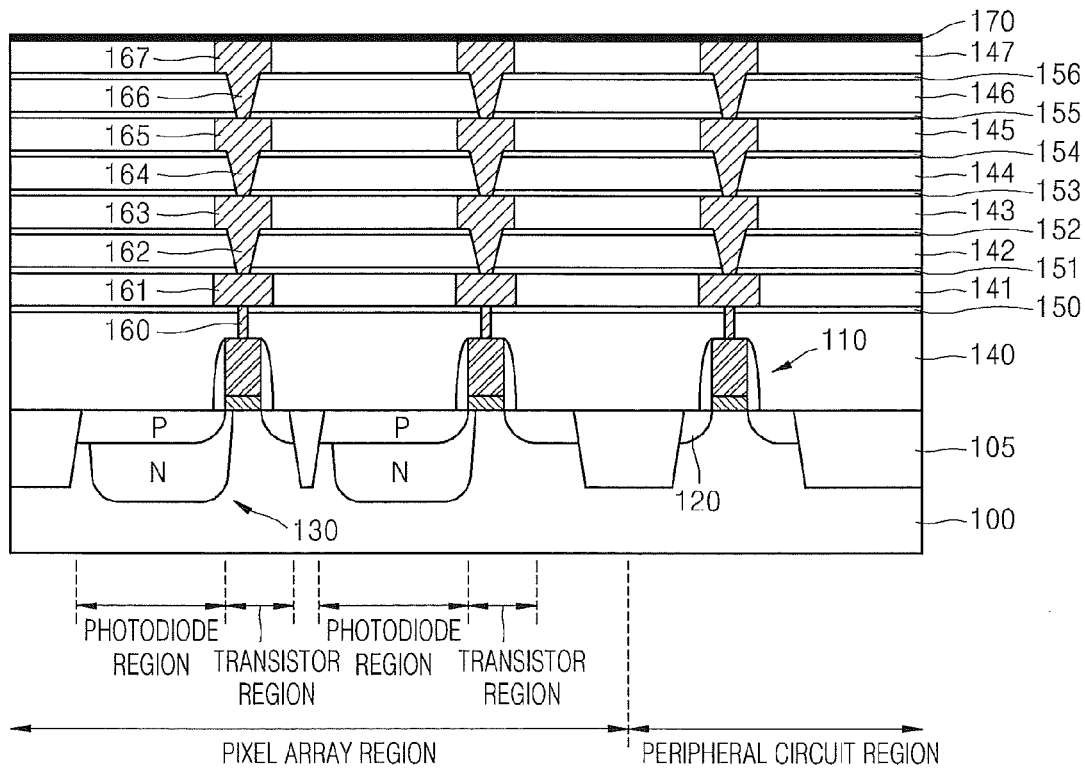

Referring to FIG. 4B, a wiring structure may be formed by repeating at least once a process for forming an insulating layer 140 in the pixel array region and the peripheral circuit region so as to cover the photodiodes 130 and the transistors 110, forming a plurality of first metal wiring layers 161 connected to the transistors 110 by respective via plugs 160 on the insulating layer 140, and forming a first interlayer insulating layer 141 for insulating the first metal wiring layers 161 from the insulating layer 140. A passivation layer 170 may be formed on the wiring structure.

In detail, the via plugs 160 may be formed by stacking a first etch stop layer 150 on the insulating layer 140 and then patterning the insulating layer 140 and the first etch stop layer 150. For example, the via plugs 160 may include tungsten (W). Then, the first metal wiring layers 161 connected to the via plugs 160 may be formed by stacking the first interlayer insulating layer 141 on the first etch stop layer 150 and then patterning the first interlayer insulating layer 141. For example, the first metal wiring layers 161 may include copper (Cu), and may be formed using a single damascene process.

A plurality of first contact holes (not shown) may be formed by sequentially stacking a second etch stop layer 151, a second interlayer insulating layer 142, a third etch stop layer 152, and a third interlayer insulating layer 143 in the order stated on the first interlayer insulating layer 141 and then patterning them. In addition, a plurality of first trenches (not shown) may be formed by patterning the stacked third etch stop layer 152 and the third interlayer insulating layer 143. A plurality of first contact plugs 162 and a plurality of second metal wiring layers 163 may be formed by filling Cu into the first contact holes and the first trenches. The second metal wiring layers 163 may be formed using a dual damascene process.

Then, a plurality of second contact holes (not shown) may be formed by sequentially stacking a fourth etch stop layer 153, a fourth interlayer insulating layer 144, a fifth etch stop layer 154, and a fifth interlayer insulating layer 145 in the order stated on the third interlayer insulating layer 143 and then patterning them. A plurality of second trenches (not shown) may be formed by patterning the stacked fifth etch stop layer 154 and the fifth interlayer insulating layer 145. A plurality of second contact plugs 164 and a plurality of third metal wiring layers 165 may be formed by filling Cu into the second contact holes and the second trenches. The third metal wiring layers 165 may be formed by using a dual damascene process.

Then, a plurality of third contact holes (not shown) may be formed by sequentially stacking a sixth etch stop layer 155, a sixth interlayer insulating layer 146, a seventh etch stop layer 156, and a seventh interlayer insulating layer 147 in the order stated on the fifth interlayer insulating layer 145 and then patterning them. A plurality of third trenches (not shown) may be formed by patterning the stacked seventh etch stop layer 156 and the seventh interlayer insulating layer 147. A plurality of third contact plugs 166 and a plurality of fourth metal wiring layers 167 may be formed by filling Cu into the third contact holes and the third trenches. The fourth metal wiring layers 167 may be formed by using a dual damascene process.

The first through seventh etch stop layers 150, 151, 152, 153, 154, 155, and 156 may include SiN. When the first through fourth metal wiring layers 161, 163, 165, and 167 include Cu, the first through seventh etch stop layers 150, 151, 152, 153, 154, 155, and 156 may prevent electromigration between the first through fourth metal wiring layers 161, 163, 165, and 167.

In the embodiments of the inventive concepts discussed above, the image sensor 1 has a wiring structure including the first through fourth metal wiring layers 161, 163, 165, and 167. However, the inventive concepts are not limited thereto, and the wiring structure may include one or more layers or a plurality of layers. In addition, the number of metal wiring layers desired in the pixel array region may differ from the number of metal wiring layers desired in the peripheral circuit region. However, in FIGS. 4A-4F, the metal wiring layers are formed in both the pixel array region and the peripheral circuit region, for convenience of description.

Figure 4C:
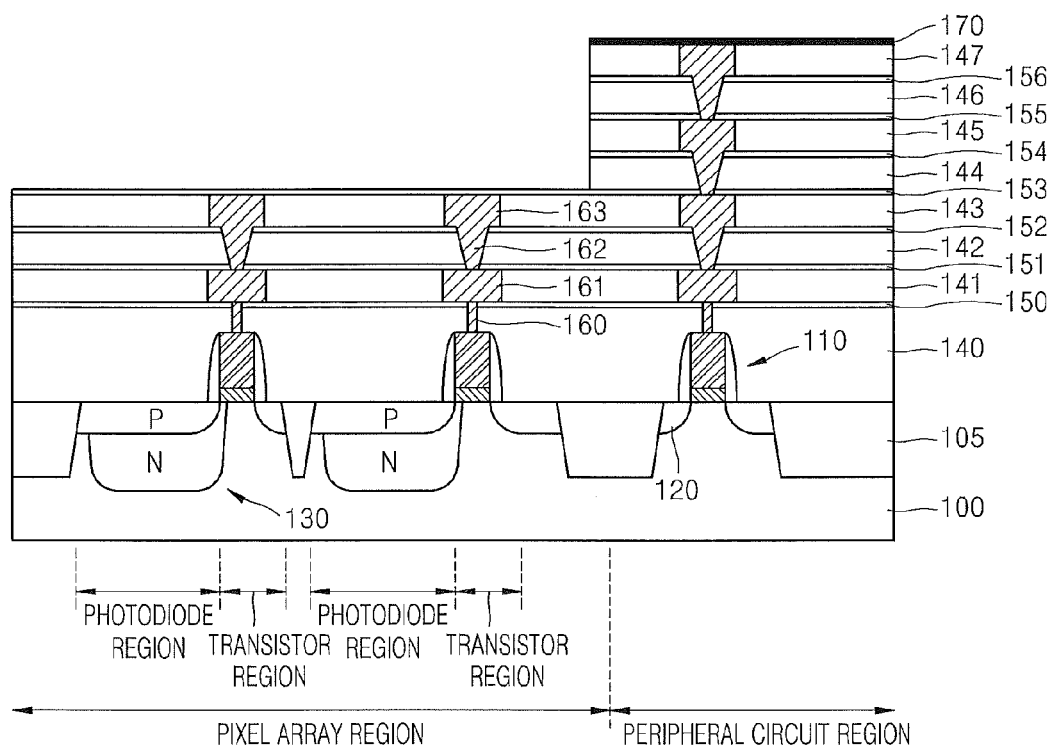

Referring to FIG. 4C, a hard mask pattern may be formed on the passivation layer 170 so as to expose the passivation layer 170 corresponding to the pixel array region. The passivation layer 170 formed in the pixel array region, the fourth through seventh interlayer insulating layers 144, 145, 146, and 147, the fifth through seventh etch stop layers 154, 155, and 156, the third and fourth metal wiring layers 165 and 167, and the second and third contact plugs 164 and 166 may be removed by using an etching process. Furthermore, the fourth etch stop layer 153 formed in the pixel array region may be removed. In this case, the metal wiring layers desired in the pixel array region may be the first and second metal wiring layers 161 and 163, and the metal wiring layers desired in the peripheral circuit region may be the first through fourth metal wiring layers 161, 163, 165, and 167.

Accordingly, as shown in FIG. 4C, the insulating layer 140, the first through fourth etch stop layers 150, 151, 152, and 153, and the first through third interlayer insulating layers 141, 142, and 143 are disposed on the photodiodes 130. As such, due to the various mediums or layers on the photodiodes 130, a refractive index of incident light may be changed, and light loss may occur.

Figure 4D:
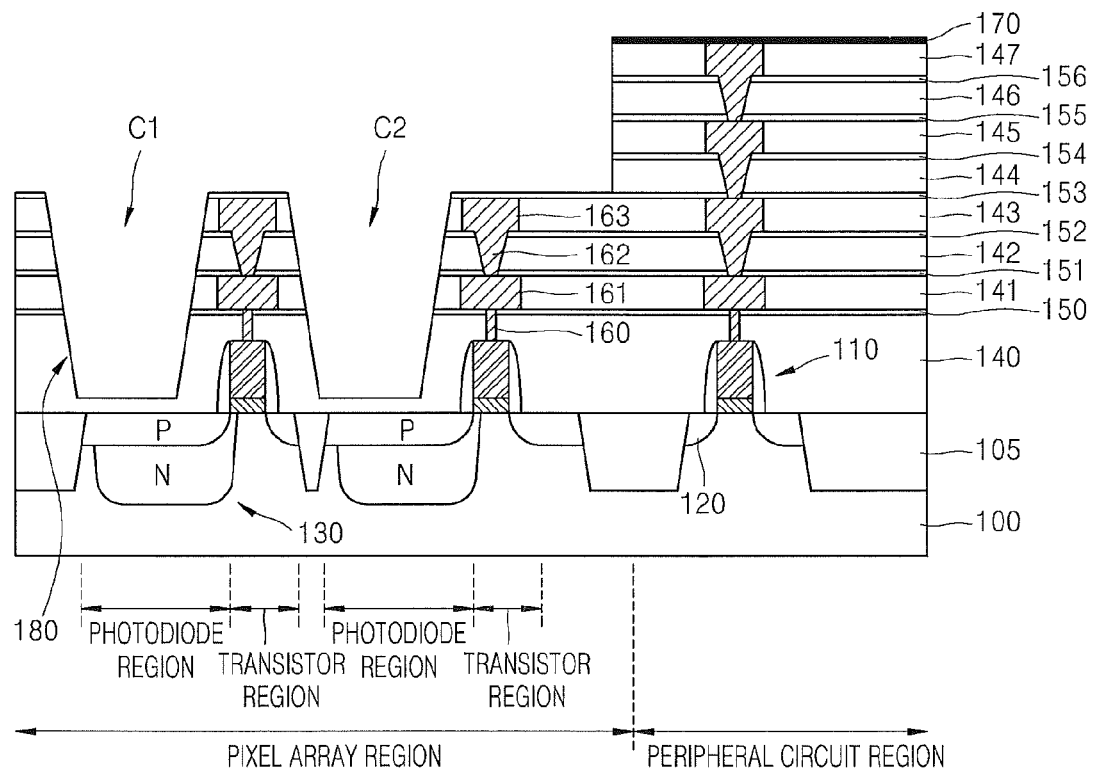

Referring to FIG. 4D, cavities C1 and C2 may be formed at locations corresponding to the photodiodes 130 (e.g., at locations aligned with the photodiodes 130 in plan view) by etching the first through fourth etch stop layers 150, 151, 152, and 153 and the first through third interlayer insulating layers 141, 142, and 143 formed on the photodiodes 130 of the pixel array region. Here, the cavities C1 and C2 may increase transmittance of light emitted toward the photodiodes 130 by further etching a part of the insulating layer 140 formed on the photodiodes 130. For example, the cavities C1 and C2 may be formed by using a plasma dry etching process. Accordingly, only a portion or part of the insulating layer 140 remains on the photodiodes 130, thereby improving light-collection efficiency and sensitivity.

Here, a plurality of interfaces 180 of the insulating layer 140 and the first through third interlayer insulating layers 141, 142, and 143 exposed by the cavities C1 and C2 are hydrophilic and thus vulnerable to moisture. For example, the insulating layer 140 and the first through third interlayer insulating layers 141, 142, and 143 may be formed of silicon dioxide ($SiO_2$). In this case, polar molecules, for example, hydroxyl (—OH) groups, may exist on the interfaces 180. That is, the interfaces 180 become hydrophilic due to the polar molecules, and thus the interfaces 180 may be vulnerable to moisture. Accordingly, when a device including the image sensor 1 is used in a hot and humid place for long periods of time, defects may occur in the photodiodes 130, the transistors 110, and/or the first and second metal wiring layers 161 and 163 connected to the transistors 110 formed in the pixel array region due to the moisture adsorbed along the interfaces 180, which may negatively affect picture quality.

In order to address the above-described problem, if a plurality of protection layers (for example, layers formed of $Si_xN_y$) were additionally formed on the interfaces 180 so that the photodiodes 130, the transistors 110, and the first and second metal wiring layers 161 and 163 (which are electrically connected to the transistors 110) existing under the insulating layer 140 and the first through third interlayer insulating layers 141, 142, and 143 exposed by the cavities C1 and C2 were protected from moisture, a refractive index of incident light may be altered due to the presence of the protection layers, and light-collection efficiency may be decreased. Also, additional processes (for example, to control the thicknesses of the protection layers) may be required, and thus the manufacturing process may become more complicated.

Figure 4E:
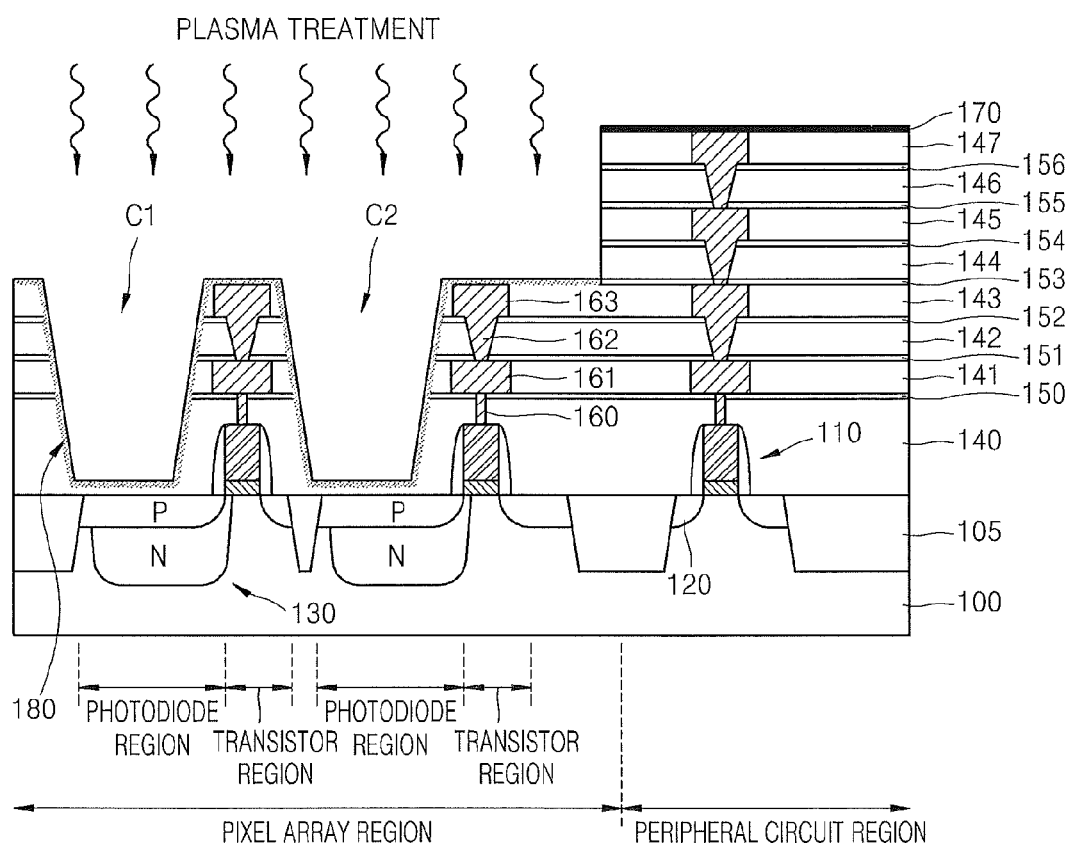

Referring to FIG. 4E, properties of the interfaces 180 of the insulating layer 140 and the first through third interlayer insulating layers 141, 142, and 143 exposed by the cavities C1 and C2 may be modified from hydrophilic into hydrophobic. In particular, the polar molecules on the interfaces 180 of the insulating layer 140 and the first through third interlayer insulating layers 141, 142, and 143 exposed by the cavities C1 and C2 may be removed by surface modification using plasma processing.

In some embodiments, plasma processing may be performed by using ammonia ($NH_3$) as a source gas. When $NH_3$, as a source gas, is injected into a plasma processing apparatus, $NH_3$ radicals ($NH_3$.) may be generated. The generated $NH_3$ radicals ($NH_3$.) remove the polar molecules on the interfaces 180. For example, the —OH groups on the interfaces 180 may react with the $NH_3$ radicals ($NH_3$.) and thus may generate $NH_3OH$, that is, —OH+$NH_3$.→$NH_3OH\uparrow$. At this time, Si—N bonding may occur in each of the interfaces 180. Thus, the interfaces 180 may be modified into hydrophobic interfaces having an improved moisture-resistance property. The source gas used in the plasma processing is not limited to $NH_3$, and thus, for example, at least one selected from the group consisting of $N_2$, $CF_4$, $SF_6$, and $NF_3$ may be used as a source gas in some embodiments.

In some embodiments, plasma processing may be performed by using a radio frequency (RF) generator. The plasma processing using an RF generator uses a relative low energy, thereby reducing the possibility that dark current may be generated due to the energy used in the plasma processing.

As described above, when the plasma processing is performed, properties of surfaces of the interfaces 180 may be altered or changed to hydrophobic, and additional thin films (such as SiN) need not be formed on the surfaces of the interfaces 180 as protective layers. In other words, in some embodiments of the present invention, one or more protection layers are not additionally formed on the respective interfaces 180, and the plasma processing is performed by using $NH_3$ as a source gas so that the polar molecules on the interfaces 180 may be removed and the Si—N bonding may occur in the interfaces 180. Accordingly, since layers each having a predetermined thickness are not additionally formed on the interfaces 180, a refractive index of incident light may not be substantially altered or changed, light-collection efficiency may not be decreased, and moisture-resistance properties of the interfaces 180 may be increased, thereby protecting elements included in the image sensor 1.

In other embodiments of the inventive concepts, before the cavities C1 and C2 are formed as shown in FIG. 4C, an interface of the exposed third interlayer insulating layer 143 may be modified from hydrophilic into hydrophobic. In particular, polar molecules on the interface of the exposed third interlayer insulating layer 143 may be removed by surface modification of plasma processing.

Figure 4F:
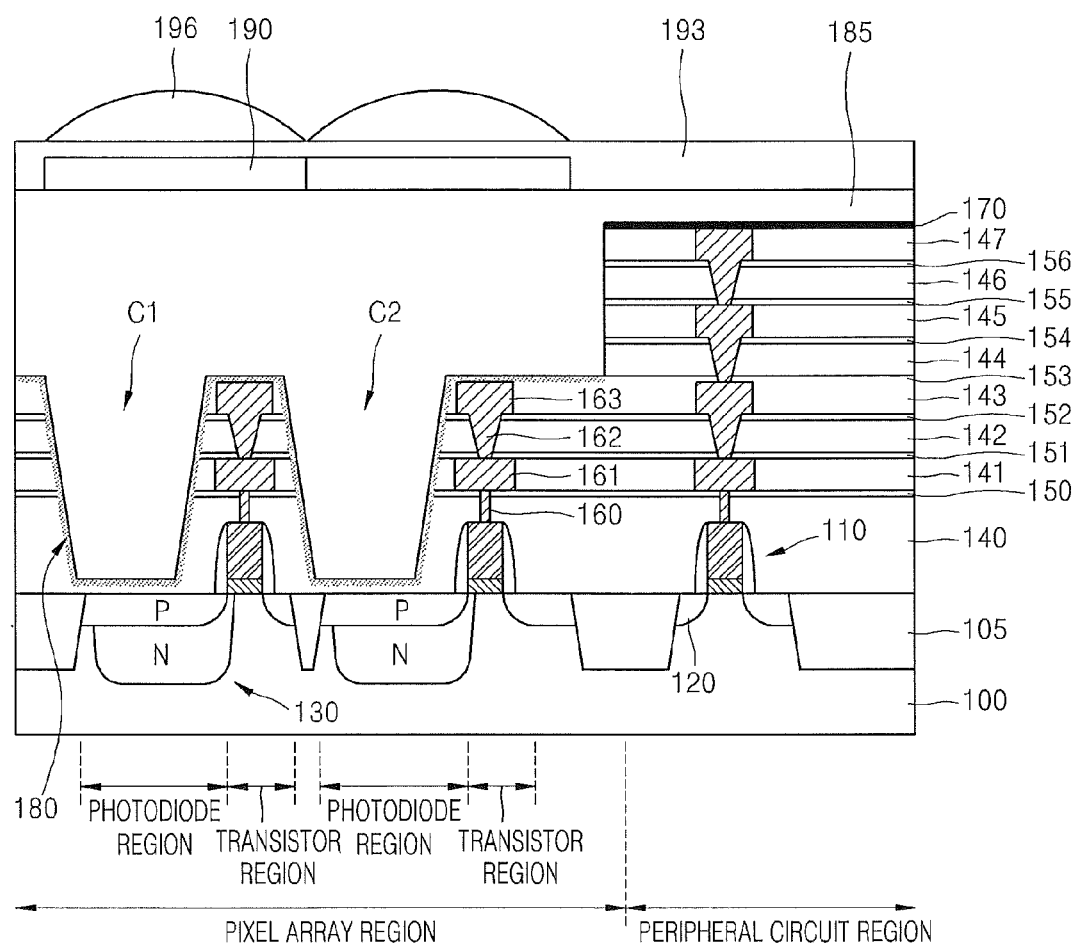

Referring to FIG. 4F, a first light transmittance layer 185 may be formed on the interfaces 180 of the insulating layer 140 and the first through third interlayer insulating layers 141, 142, and 143 that have been modified to be hydrophobic. The first light transmittance layer 185 may be planarized by using a chemical mechanical polishing (CMP) process or an etch-back process using plasma. In this regard, the first light transmittance layer 185 may be a transparent resin layer in some embodiments. For example, the first light transmittance layer 185 may be formed of silicon oxide or silicon nitride by chemical vapor deposition. In another embodiment of the inventive concepts, the first light transmittance layer 185 may be formed of an organic polymer compound.

A color filter 190 may be formed on a portion of an upper surface of the first light transmittance layer 185, and a second light transmittance layer 193 may be formed on the color filter 190. The color filter 190 may be configured as a color filter array comprised of red (R), green (G), and/or blue (B) colors. In this regard, the second light transmittance layer 193 may be a transparent resin layer, for example, a silicon oxide layer or a silicon nitride layer. A micro lens 196 may be formed on a portion of the second light transmittance layer 193. Thus, incident light passes through the micro lens 196, only light of required colors is selected by the color filter 190, and the light of the selected colors may be accumulated in the photodiodes 130 via the first light transmittance layer 185 without unwanted refraction or losses due to additional protective layers.

FIGS. 5A through 5F are cross-sectional views illustrating fabrication steps in a method of manufacturing the image sensor of FIG. 1, according to another embodiment of the inventive concepts. Pixel array regions of FIGS. 5A through 5F correspond to the cross-section taken along the line I-I' of FIG. 3.

Figure 5A:
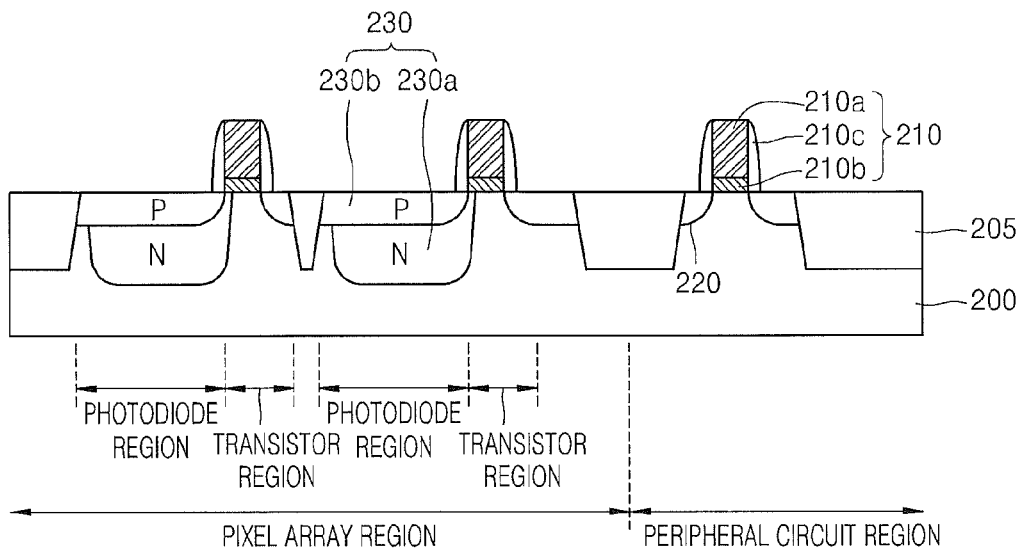
FIGS. 5A through 5F are cross-sectional views sequentially illustrating a method of manufacturing the image sensor of FIG. 1, according to another embodiment of the inventive concepts.

Referring to FIG. 5A, a substrate 200 including the pixel array region and a peripheral circuit region is provided. The substrate 200 may be substantially configured in the same manner as the substrate 100 of FIG. 4A, and thus, a detailed description thereof will be omitted here. A device isolation layer 205 defining an active region may be formed in the substrate 200 by using a shallow trench isolation (STI) process. Although not shown in FIG. 5A, an epitaxial layer may be formed on the substrate 200, and a plurality of photodiodes 230 and a plurality of transistors 210 may be formed in the epitaxial layer.

A plurality of gate insulating layers 210b and a plurality of gate electrode layers 210a are sequentially stacked in the order stated on the substrate 200 and are then patterned, thereby forming the plurality of transistors 210. A plurality of spacers 210c may be formed on respective sidewalls of the transistors 210. A plurality of source/drain regions 220 are respectively formed at both sides of each of the transistors 210 by doping the substrate 200 with impurities.

N-type impurities, such as P, As, or Sb. are injected into respective photodiode regions of the substrate 200 so as to form a plurality of first wells 230a, and P-type impurities such as B, Ga, or In are injected into the respective photodiode regions of the substrate 200 so as to form a plurality of second wells 230b, thereby forming the photodiodes 230, which are P—N junction diodes. However, embodiments of the inventive concepts are not so limited, and thus the first wells 230a may be formed by injecting P-type impurities into the photodiode regions of the substrate 200, and the second wells 230b may be formed by injecting N-type impurities. In addition, the order for forming the first wells 230a and the second wells 230a may be changed. In some embodiments of the inventive concepts, the transistors 210 may be formed after the photodiodes 230 are formed. However, in other embodiments of the inventive concepts, the photodiodes 230 may be formed after the transistors 210 are formed.

Figure 5B:
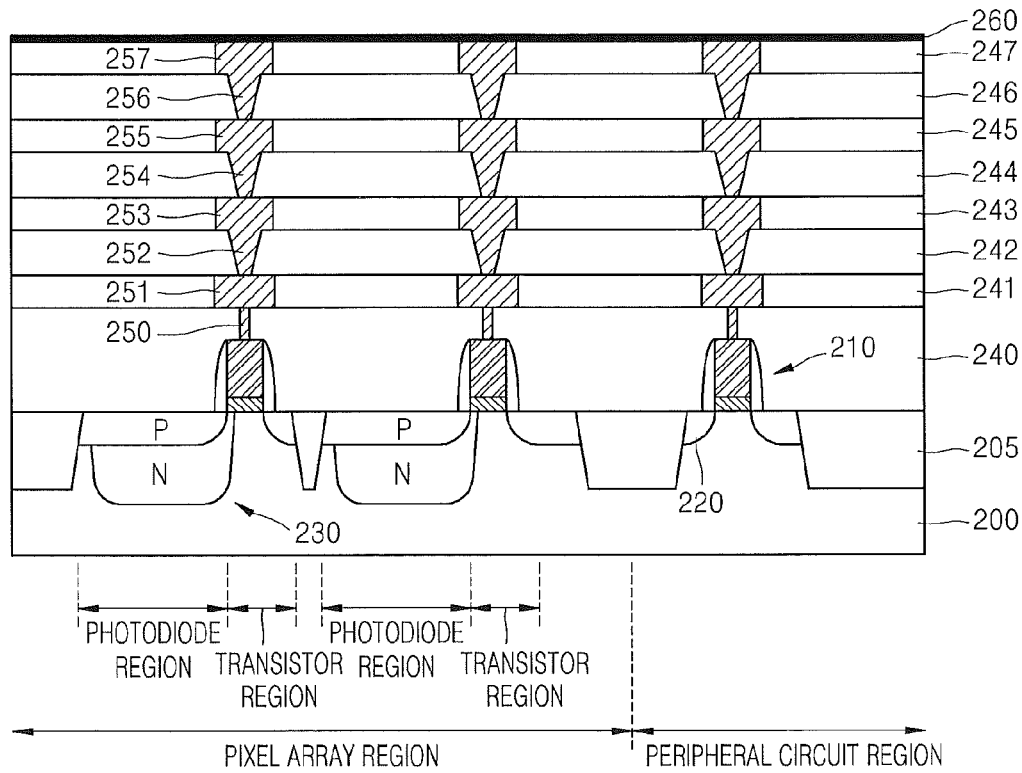

Referring to FIG. 5B, a wiring structure may be formed by repeating at least once a process for forming an insulating layer 240 on the pixel array region and the peripheral circuit region so as to cover the photodiodes 230 and the transistors 210, forming a plurality of first metal wiring layers 251 connected to the transistors 210 by respective via plugs 250 extending through the insulating layer 240, and forming a first interlayer insulating layer 241 for insulating the first metal wiring layers 251 from the insulating layer 240. A passivation layer 260 may be formed on the wiring structure.

In particular, the via plugs 250 are formed by patterning the insulating layer 240. For example, the via plugs 250 may include tungsten (W). The first metal wiring layers 251 electrically connected to the respective via plugs 250 are formed on the insulating layer 240, and the first interlayer insulating layer 241 is formed on the first metal wiring layers 251.

The second interlayer insulating layer 242 is stacked on the first interlayer insulating layer 241, a plurality of first contact holes (not shown) are formed by patterning the second interlayer insulating layer 242, and a plurality of first contact plugs 252 are formed by filling metal materials into the first contact holes. A plurality of second metal wiring layers 253 electrically connected to the respective first contact plugs 252 are stacked on the second interlayer insulating layer 242, and a third interlayer insulating layer 243 is stacked on the second metal wiring layers 253.

A fourth interlayer insulating layer 244 is stacked on the third interlayer insulating layer 243, a plurality of second contact holes (not shown) are formed by patterning the fourth interlayer insulating layer 244, and a plurality of second contact plugs 254 are formed by filling metal materials into the second contact holes. A plurality of third metal wiring layers 255 electrically connected to the respective second contact plugs 254 are formed on the fourth interlayer insulating layer 244, and a fifth interlayer insulating layer 245 is stacked on the third metal wiring layers 255.

A sixth interlayer insulating layer 246 is stacked on the fifth interlayer insulating layer 245, a plurality of third contact holes (not shown) are formed by patterning the sixth interlayer insulating layer 246, and a plurality of third contact plugs 256 are formed by filling metal materials into the third contact holes. A plurality of fourth metal wiring layers 257 electrically connected to the respective third contact plugs 256 are formed on the sixth interlayer insulating layer 246, and a seventh interlayer insulating layer 247 is stacked on the fourth metal wiring layers 257.

For example, the first through fourth metal wiring layers 251, 253, 255, and 257 may include aluminum (Al). In this case, as an electrical movement or electromigration phenomenon may not substantially occur in aluminum (Al), there may be little or no need to form an etch stop layer in the processes for forming the first through fourth metal wiring layers 251, 253, 255, and 257.

In some embodiments, the image sensor has the wiring structure including the first through fourth metal wiring layers 251, 253, 255, and 257. However, embodiments of the inventive concepts are not so limited, and the metal wiring layer may include one or more layers or a plurality of layers. In addition, the number of metal wiring layers desired in the pixel array region may differ from the number of metal wiring layers desired in the peripheral circuit region, but the metal wiring layers may be illustrated herein as being formed in both the pixel array region and the peripheral circuit region for convenience of description.

Figure 5C:
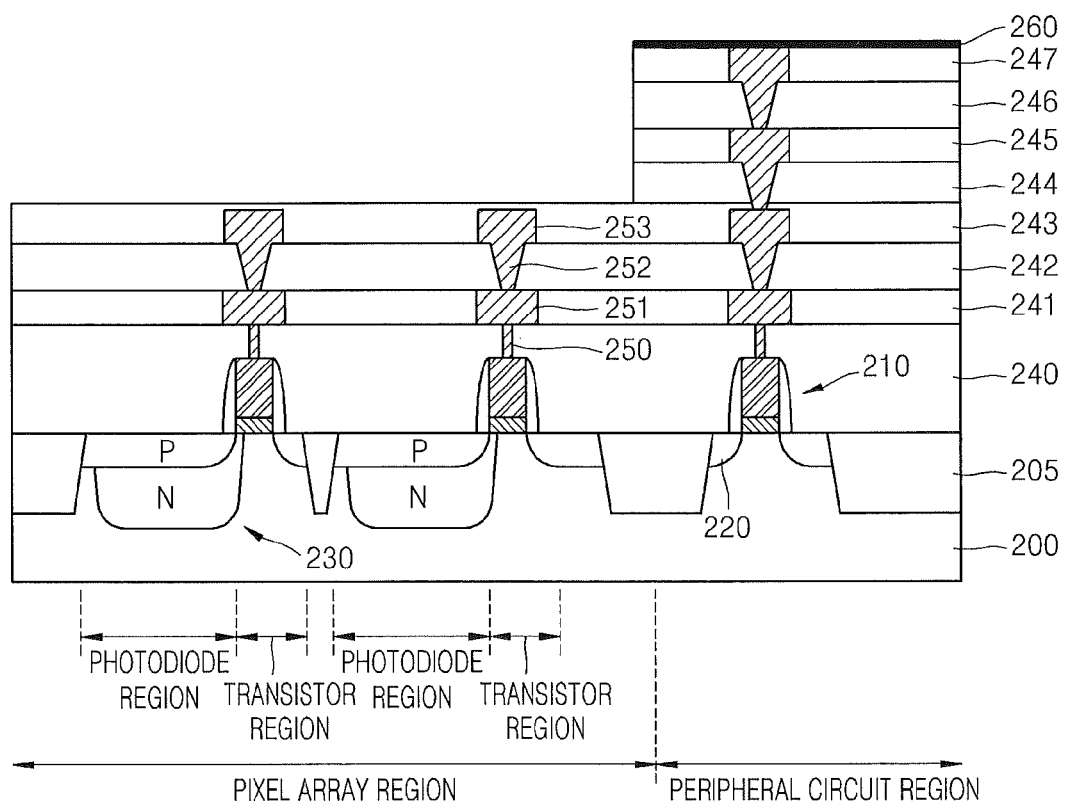

Referring to FIG. 5C, a hard mask pattern may be formed on the passivation layer 260 so as to expose the passivation layer 260 corresponding to the pixel array region. The passivation layer 260 formed in the pixel array region, the fourth through seventh interlayer insulating layers 244, 245, 246, and 247, the third and fourth metal wiring layers 245 and 247, and the second and third contact plugs 244 and 246 may be removed by using an etching process. In this case, the metal wiring layers desired in the pixel array region may be the first and second metal wiring layers 251 and 253, and the metal wiring layers desired in the peripheral circuit region may be the first through fourth metal wiring layers 251, 253, 255, and 257.

Here, the insulating layer 240 and the first through third interlayer insulating layers 241, 242, and 243 are disposed on the photodiodes 230. As such, due to the various mediums or layers on the photodiodes 230, a refractive index of incident light may be changed, and light loss may occur.

Figure 5D:
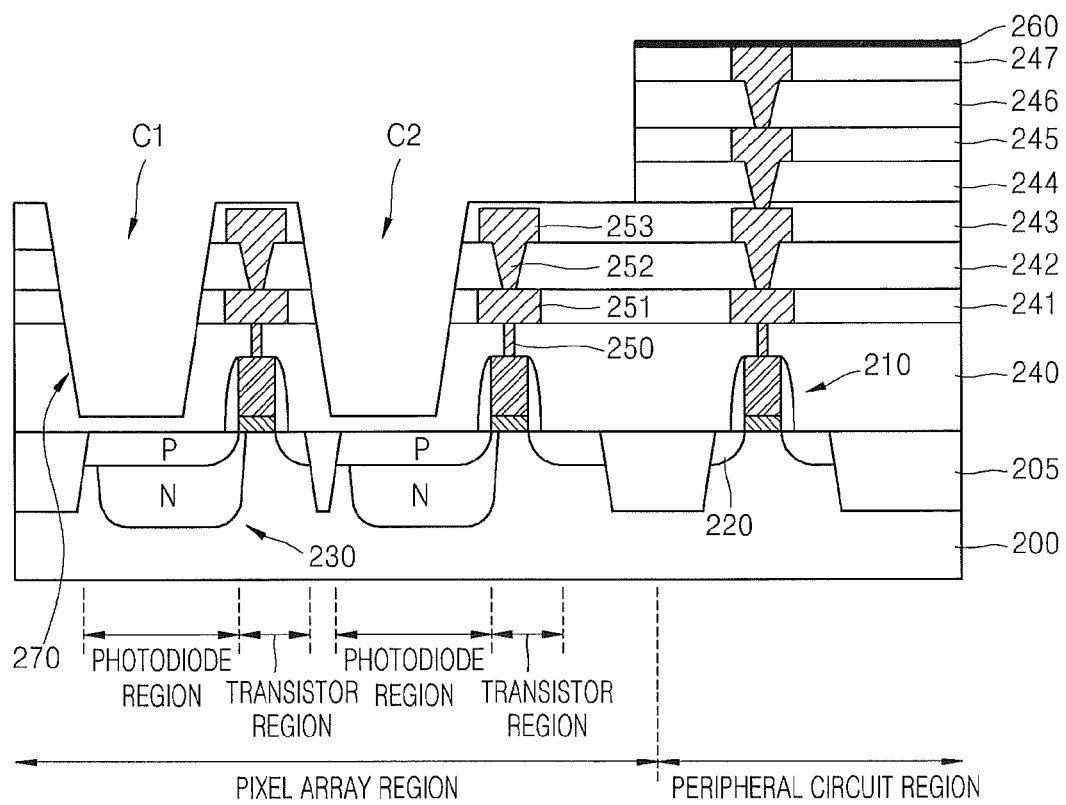

Referring to FIG. 5D, cavities C1 and C2 may be formed at locations corresponding to the photodiodes 230 by etching first through third interlayer insulating layers 241, 242, and 243 formed on the photodiodes 230 of the pixel array region. Here, the cavities C1 and C2 may increase transmittance of light emitted toward the photodiodes 230 by further etching a part of the insulating layer 240 formed on the photodiodes 230. For example, the cavities C1 and C2 may be formed by using a plasma dry etching process. Accordingly, only a portion or part of the insulating layer 240 remains on the photodiodes 230, thereby improving light-collection efficiency and sensitivity.

Here, a plurality of interfaces 270 of the insulating layer 240 and the first through third interlayer insulating layers 241, 242, and 243 exposed by the cavities C1 and C2 are hydrophilic and thus vulnerable to moisture. For example, the insulating layer 240 and the first through third interlayer insulating layers 241, 242, and 243 may be formed of $SiO_2$. In this case, polar molecules, for example, —OH groups, may exist on the interfaces 270. That is, the interfaces 270 may become hydrophilic due to the polar molecules, and thus may be vulnerable to moisture. Accordingly, when a device including the image sensor is used in a hot and humid place for long periods of time, defects may occur in the photodiodes 230, the transistors 210, and/or the first and second metal wiring layers 251 and 253 connected to the transistors 210 formed in the pixel array region due to the moisture adsorbed along the interfaces 270, which may thereby result in poor or reduced picture quality.

In order to address the above-described problem, if a plurality of protection layers (for example, layers formed of $Si_xN_y$) were additionally formed on the interfaces 270 so that the photodiodes 230, the transistors 210, and the first and second metal wiring layers 251 and 253 (which are electrically connected to the transistors 210) existing under the insulating layer 240 and the first through third interlayer insulating layers 241, 242, and 243 exposed by the cavities C1 and C2 were protected from moisture, a refractive index of incident light may be changed due to the protection layers, and light-collection efficiency may be decreased. Also, additional processes (for example, to control the thicknesses of the protection layers) may be required, and thus the manufacturing process may become more complicated.

Figure 5E:
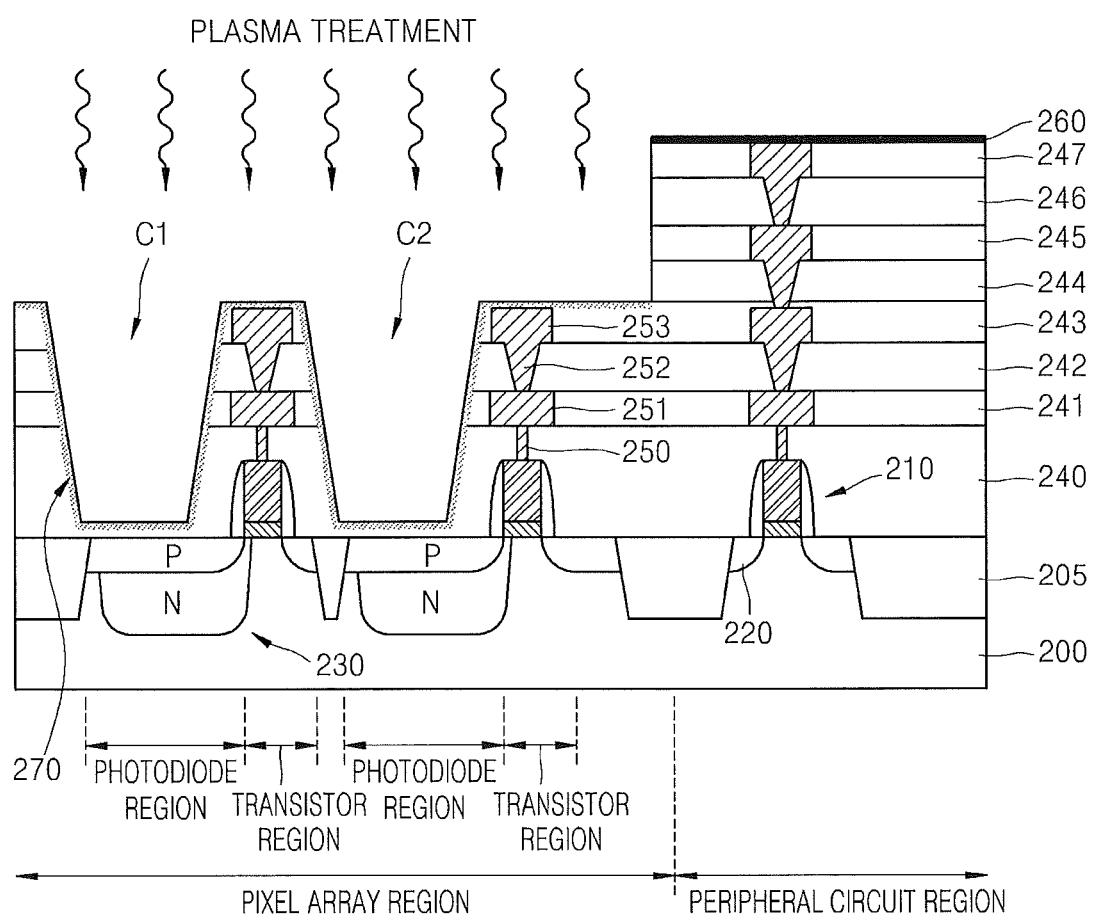

Referring to FIG. 5E, properties of the interfaces 270 of the insulating layer 240 and the first through third interlayer insulating layers 241, 242, and 243 exposed by the cavities C1 and C2 may be modified from hydrophilic into hydrophobic. In particular, the polar molecules on the interfaces 270 of the insulating layer 240 and the first through third interlayer insulating layers 241, 242, and 243 exposed by the cavities C1 and C2 may be reduced or removed by using plasma processing to modify the surfaces including the interfaces 270.

In some embodiments, plasma processing may be performed by using $NH_3$ as a source gas. When $NH_3$, as a source gas, is injected into a plasma processing apparatus, $NH_3$ radicals ($NH_3 \cdot$) may be generated. The generated $NH_3$ radicals ($NH_3 \cdot$) may remove the polar molecules on the interfaces 270. For example, the —OH groups on the interfaces 270 may react with the $NH_3$ radicals ($NH_3 \cdot$) and thus may generate $NH_3OH$, that is, —OH+$NH_3 \cdot \rightarrow NH_3OH\uparrow$. At this time, Si—N bonding may occur in each of the interfaces 270. Thus, the interfaces 270 may be modified into hydrophobic interfaces having an improved moisture-resistance property. The source gas used in the plasma processing is not limited to $NH_3$, and thus, for example, at least one selected from the group consisting of $N_2$, $CF_4$, $SF_6$, and $NF_3$ may be used as a source gas in some embodiments.

In some embodiments, plasma processing may be performed by using an RF generator. The plasma processing using an RF generator may use a relative low energy, thereby reducing the possibility that dark current may be generated due to the energy used in the plasma processing.

As described above, when the plasma processing is performed, properties of surfaces of the interfaces 270 may be changed, but additional thin films are not formed on the surfaces of the interfaces 270. Thus, according to some embodiments, a plurality of protection layers are not additionally formed on the respective interfaces 270 and the plasma processing is performed by using $NH_3$ as a source gas so that the polar molecules on the interfaces 270 may be removed and the Si—N bonding may occur in each of the interfaces 270. Accordingly, since layers each having a predetermined thickness are not additionally formed on the interfaces 270, a refractive index of incident light may not be substantially changed, light-collection efficiency may not be substantially decreased, and moisture-resistance properties of the interfaces 270 may be increased, thereby protecting internal elements.

In other embodiments of the inventive concepts, before the cavities C1 and C2 are formed, as shown in FIG. 5C, the interface of the exposed third interlayer insulating layer 243 may be modified from hydrophilic into hydrophobic. In particular, polar molecules on an interface of the exposed third interlayer insulating layer 243 may be removed by surface modification using plasma processing.

Figure 5F:
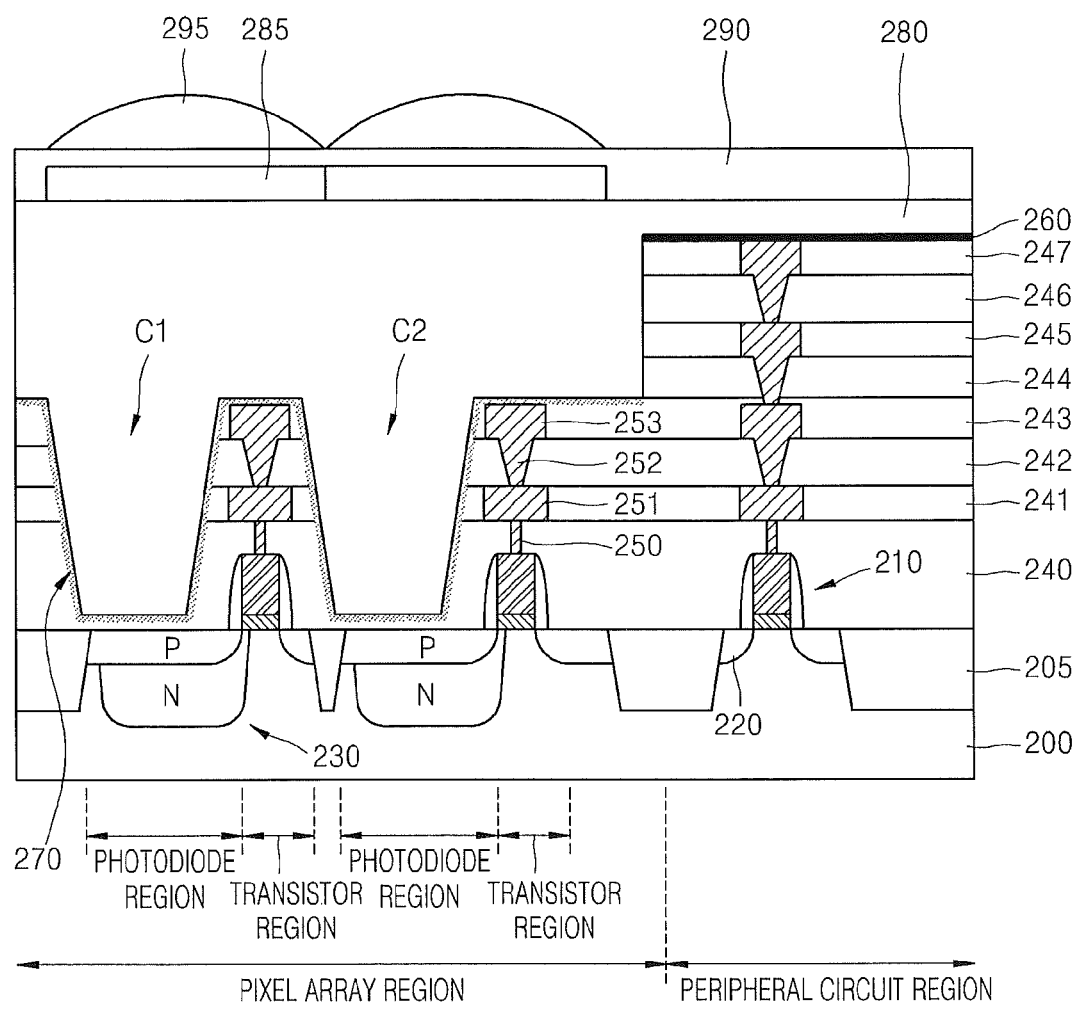

Referring to FIG. 5F, a first light transmittance layer 280 may be formed directly on the interfaces 270 of the insulating layer 240 and the first through third interlayer insulating layers 241, 242, and 243 that are modified into hydrophobic surfaces. The first light transmittance layer 280 may be planarized by using a CMP process or an etchback process using plasma. In this regard, the first light transmittance layer 280 may be a transparent resin layer. For example, the first light transmittance layer 280 may be formed of silicon oxide or silicon nitride by chemical vapor deposition. In other embodiments of the inventive concepts, the first light transmittance layer 280 may be formed of an organic polymer compound.

A color filter 285 may be formed on a portion of an upper surface of the first light transmittance layer 280, and a second light transmittance layer 290 may be formed on the color filter 285. The color filter 285 may be configured as a color filter array comprised of red (R), green (G), and/or blue (B) colors. In this regard, the second light transmittance layer 290 may be a transparent resin layer, for example, a silicon oxide layer or a silicon nitride layer. A micro lens 295 may be formed on a portion of the second light transmittance layer 290. Thus incident light may pass through the micro lens 295, light of a desired color may be selected by the color filter 285, and the light of the selected color may be accumulated in the photodiodes 230 via the first light transmittance layer 280.

Figure 6:
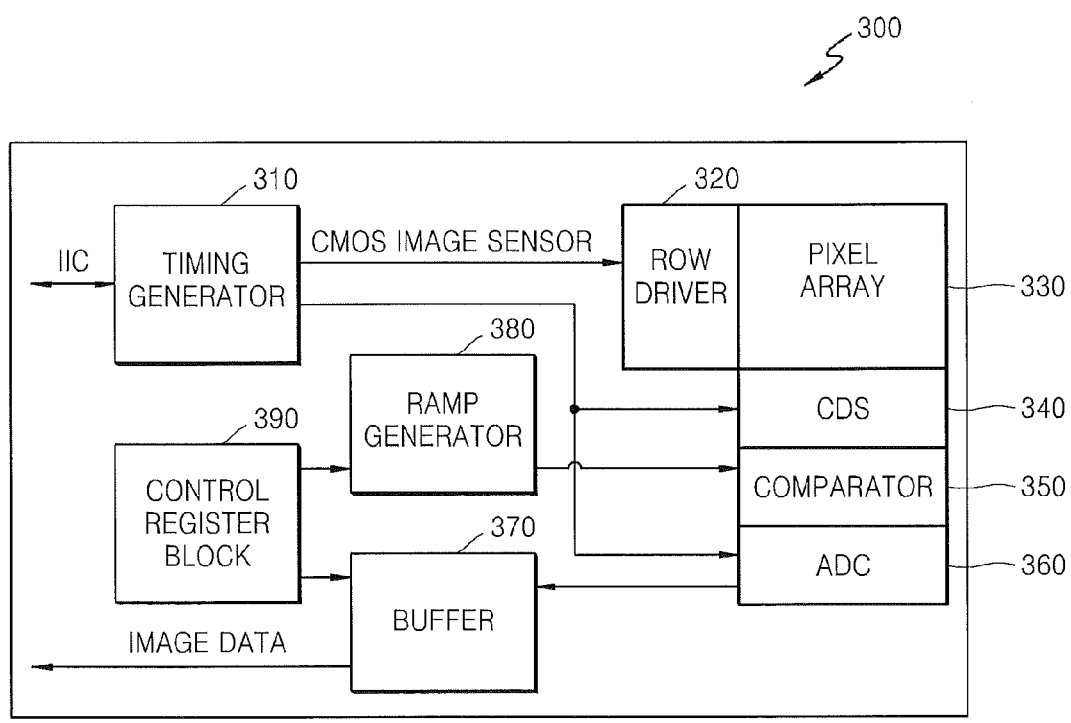
FIG. 6 is a schematic block diagram illustrating an image sensor chip including an image sensor, according to some embodiments of the inventive concepts.

FIG. 6 is a schematic block diagram illustrating an image sensor chip 300 including the image sensor, according to some embodiments of the inventive concepts.

Referring to FIG. 6, the image sensor chip 300 includes a timing generator 310, a row driver 320, a pixel array 330, a correlated double sampling (CDS) unit 340, a comparator 350, an analog-to-digital converter (ADC) 360, a buffer 370, a lamp generator 380, and a control register block 390. The row driver 320, the pixel array 330, the CDS unit 340, the comparator 350, and the ADC 360 may be manufactured by using methods of manufacturing the image sensor described above with reference to FIGS. 4A-4F and 5A-5F.

The row driver 320 provides signals for driving each of a plurality of pixels to the pixel array 330. The pixel array 330 converts information of a subject collected in an optical lens, that is, optical data into electrons so as to generate electrical image signals. The CDS 340 removes noise from the image signals generated by the pixel array 330 so as to select required signals. The comparator 350 compares the selected signals with a predetermined value. The ADC 360 converts output of the comparator 350 into digital data. The buffer 370 buffers the digital data output from the ADC 360.

Figure 7:
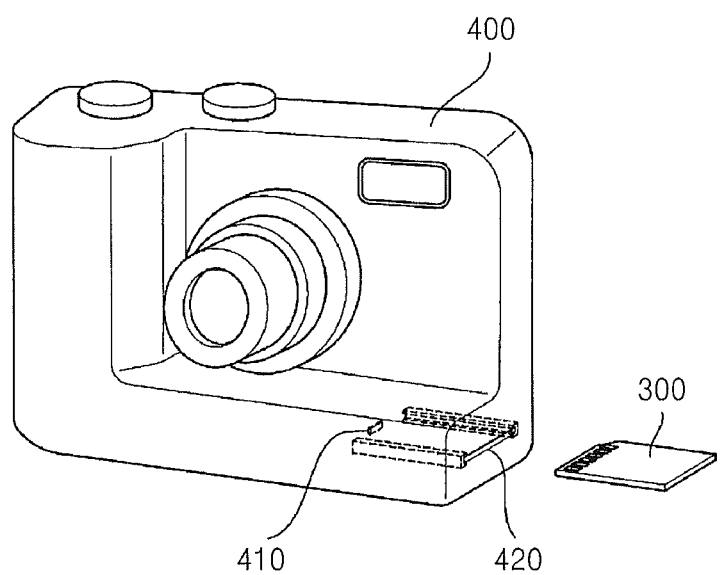
FIG. 7 schematically illustrates a camera including the image sensor chip of FIG. 6.

FIG. 7 schematically illustrates a camera 400 including the image sensor chip 300 of FIG. 6.

Referring to FIG. 7, the camera 400 includes a digital signal processor (DSP) 410 including a camera controller, an image signal processor, etc. and an insertion portion 420 in which the image sensor chip 300 may be installed. In FIG. 7, the image sensor chip 300 is illustrated as an attachable/detachable chip, but the DSP 410 and the image sensor chip 300 may be configured as one module.

Figure 8:
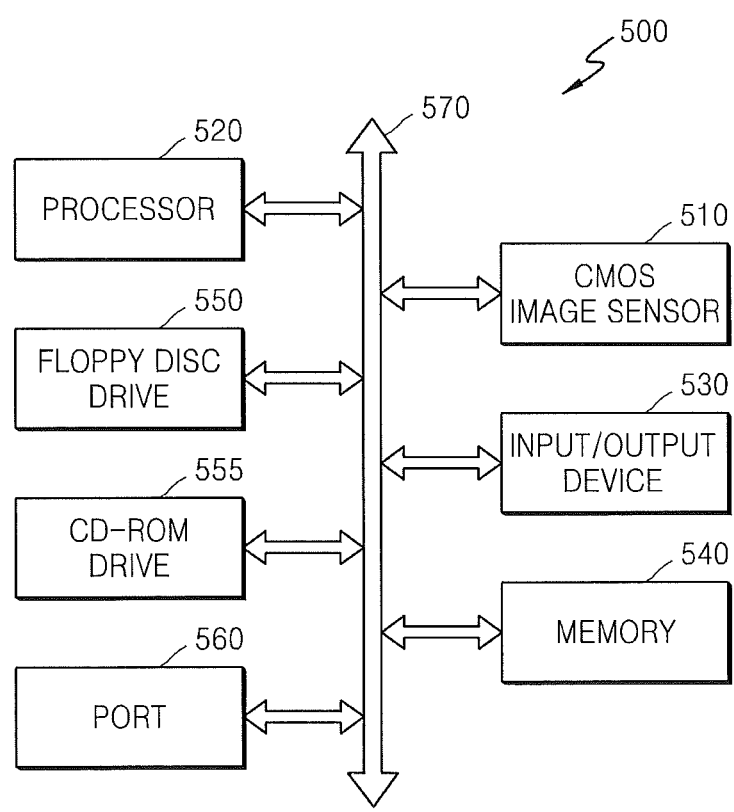
FIG. 8 is a schematic block diagram illustrating an electronic system including an image sensor, according to some embodiments of the inventive concepts.

FIG. 8 is a schematic block diagram illustrating an electronic system 500 including the image sensor 1, according to some embodiments of the present invention.

Referring to FIG. 8, the electronic system 500 includes a CMOS image sensor 510 and processes an output image of the CMOS image sensor 510. For example, the electronic system 500 may be any system including the CMOS image sensor 510, for example, a computer system, a camera system, a scanner, an image safety system, etc.

In particular, the electronic system 500 may include a processor 520, an input/output device 530, a memory 540, a floppy disc drive 550, and a compact disc read-only memory (CD-ROM) drive 555, which may communicate with one another via a port 560, The CMOS image sensor 510 may include either of the image sensors illustrated in FIGS. 1 through 7.

The CMOS image sensor 510 may receive control signals or data from the processor 520 or other devices included in the electronic system 500. The CMOS image sensor 510 may provide signals defining images based on the received control signals or data to the processor 520. The processor 520 may process the signals received from the CMOS image sensor 510.

The processor 520 may execute a program and control the electronic system 500. The processor 520 may be any one of a microprocessor, a digital signal processor, a microcontroller, or an apparatus similar thereto.

The input/output device 530 may be used to input or output data of the electronic system 500. The electronic system 500 may be connected to an external device, for example, a personal computer or a network, by using the input/output device 530 so as to exchange data with the external device. The input/output device 530 may be any one of a keypad, a keyboard, or a display device.

The memory 540 may store a code and/or data for operating the processor 520 or store data processed by the processor 520. The port 560 may be connected to a video card, a sound card, a memory card, a universal serial bus (USB) device, or the like or communicate data with other systems.

According to embodiments of the inventive concepts, interfaces of exposed interlayer insulating layers in an image sensor in which the interlayer insulating layers are partially removed at locations corresponding to photodiodes are modified into hydrophobic surfaces by plasma processing in order to increase light-collection efficiency, so that moisture-resistance properties of the interfaces of the interlayer insulating layers exposed by cavities may be improved. Thus, defects may be reduced or prevented from occurring in elements included in the image sensor, thereby reducing or preventing poor picture quality.

Also, according to embodiments of the inventive concepts, moisture-resistance properties of the interfaces can be improved without forming additional protective layers (such as SiN layers) on or along the interfaces of the insulating layer and the interlayer insulating layers that are exposed by the cavities. Thus, variations in a refractive index of incident light due to the protective layers and decreases in light-collection efficiency may be reduced or prevented. Furthermore, since additional processes for controlling thicknesses of the protection layers may not be necessary, the manufacturing process may be simplified.

Furthermore, according to embodiments of the inventive concepts, plasma processing may be performed using a relatively low energy by using a plasma RF generator, and thus dark current that may be generated due to the plasma processing may be prevented.

While the inventive concepts have been particularly shown and described with reference to exemplary embodiments thereof, it will be understood that various changes in form and details may be made therein without departing from the spirit and scope of the following claims.

What is claimed is:

1. An image sensor device, comprising:
   a substrate including a photodiode therein;
   an insulating layer on the substrate;
   a wiring structure on the insulating layer, the wiring structure comprising at least one wiring layer, at least one insulating interlayer, and a cavity extending therein over the photodiode, wherein the at least one insulating interlayer comprises a hydrophobic surface that defines a portion of the cavity without altering a refractive index thereof; and
   a light transmission layer in the cavity directly on the hydrophobic surface.

2. The image sensor of claim 1, wherein the cavity extends completely through the wiring structure and is defined by the hydrophobic surface of the at least one insulating interlayer along sidewalls thereof and a hydrophobic surface of the insulating layer along a surface thereof between the sidewalls of the cavity.

3. The image sensor of claim 2, wherein the cavity further extends at least partially into the insulating layer.

4. The image sensor of claim 2, wherein the hydrophobic surfaces of the at least one insulating interlayer and the insulating layer are free of hydroxyl (—OH) groups.

5. The image sensor of claim 1, further comprising:
   a microlens on the light transmission layer opposite the hydrophobic surface, wherein the cavity is at least partially aligned with the microlens and the photodiode in plan view to provide an optical transmission path therebetween.

6. An image sensor comprising:
   a substrate comprising a pixel array region and a peripheral circuit region;
   a plurality of transistors in the pixel array region and the peripheral circuit region;
   at least one photodiode disposed in the pixel array region;
   an insulating layer disposed on the substrate in which the plurality of transistors and the at least one photodiode are formed;
   at least one metal wiring layer disposed on the insulating layer and connected to the plurality of transistors; and
   at least one interlayer insulating layer disposed on the at least one metal wiring layer so as to insulate the at least one metal wiring layer from the insulating layer,
   wherein a part of the at least one interlayer insulating layer is exposed by etching, wherein an interface of the exposed at least one interlayer insulating layer is modified into hydrophobic, and wherein the hydrophobic interface of the exposed at least one interlayer insulating layer does not alter a refractive index thereof.

7. The image sensor of claim 6, wherein the insulating layer and the at least one interlayer insulating layer comprise a cavity on a location corresponding to the photodiode, and the interfaces of the insulating layer and the at least one interlayer insulating layer that are exposed by the cavity are modified into hydrophobic.

8. The image sensor of claim 6, wherein the interfaces of the insulating layer and the at least one interlayer insulating layer that are exposed by the cavity are modified into hydrophobic by removing polar molecules on the interface by surface modification of plasma processing.

9. The image sensor of claim 6, further comprising:
   a first etch stop layer disposed on the insulating layer; and
   a plurality of via plugs formed by partially patterning the insulating layer and the first etch stop layer,
      wherein the at least one metal wiring layer comprises a first metal wiring layer connected to the plurality of via plugs.

10. The image sensor of claim 9, wherein the at least one interlayer insulating layer comprises first through third interlayer insulating layers disposed on the first metal wiring layer, wherein the image sensor further comprises:
   a second etch stop layer disposed between the first interlayer insulating layer and the second interlayer insulating layer;
   a third etch stop layer disposed between the second interlayer insulating layer and the third interlayer insulating layer; and
   a plurality of contact plugs formed by patterning the second etch stop layer, the second interlayer insulating layer, the third etch stop layer, and the third interlayer insulating layer,
   wherein the at least one metal layer further comprises a second metal wiring layer formed by patterning the third etch stop layer and the third interlayer insulating layer.

11. The image sensor of claim 10, wherein the second metal wiring layer comprises copper.

12. The image sensor of claim 10, further comprising a passivation layer disposed on the second metal wiring layer.

13. The image sensor of claim 12, wherein the cavity is formed by partially etching the passivation layer, the insulating layer, the first through third interlayer insulating layers, and the first through third etch stop layers, and thus a part of the insulating layer remains on the photodiode.

14. The image sensor of claim 9, wherein the at least one interlayer insulating layer comprises first through third interlayer insulating layers disposed on the first metal wiring layer, wherein the image sensor further comprises a plurality of contact plugs formed by patterning the second interlayer insulating layer, wherein the at least one metal wiring layer further comprises a second metal wiring layer insulated from the second interlayer insulating layer by the third interlayer insulating layer.

15. The image sensor of claim 14, wherein the second metal wiring layer comprises aluminum.

16. The image sensor of claim 14, further comprising a passivation layer disposed on the second metal wiring layer.

17. The image sensor of claim 16, wherein the cavity is formed by partially etching the passivation layer, the insulating layer, and the first through third insulating layers, and thus a part of the insulating layer remains on the photodiode.

18. An electronic system comprising:
an image sensor according to claim 6;
a processor for communicating with the image sensor via a bus; and
an input/output device for communicating with the bus.

19. An image sensor comprising:
a substrate comprising a pixel array region and a peripheral circuit region;
a plurality of transistors in the pixel array region and the peripheral circuit region;
at least one photodiode disposed in the pixel array region;
an insulating layer disposed on the substrate in which the plurality of transistors and the at least one photodiode are formed;
at least one metal wiring layer disposed on the insulating layer and connected to the plurality of transistors;
at least one interlayer insulating layer disposed on the at least one metal wiring layer so as to insulate the at least one metal wiring layer from the insulating layer, wherein a part of the at least one interlayer insulating layer is exposed by etching, and wherein an interface of the exposed at least one interlayer insulating layer is modified into hydrophobic;
a light transmittance layer disposed on the interface of the insulating layer and the at least one interlayer insulating layer that are modified into hydrophobic;
a color filter layer disposed on a portion of the light transmittance layer; and
a micro lens disposed on a portion of the color filter layer.

20. The image sensor of claim 19, wherein the light transmittance layer is a transparent resin layer.

* * * * *